(12) United States Patent
Snyder et al.

(10) Patent No.: US 11,569,231 B2
(45) Date of Patent: Jan. 31, 2023

(54) NON-PLANAR TRANSISTORS WITH CHANNEL REGIONS HAVING VARYING WIDTHS

(71) Applicant: Intel Corporation, Santa Clara, CA (US)

(72) Inventors: Stephen D Snyder, Portland, OR (US); Leonard Guler, Hillsboro, OR (US); Richard Schenker, Portland, OR (US); Michael K Harper, Hillsboro, OR (US); Sam Sivakumar, Beaverton, OR (US); Urusa Alaan, Hillsboro, OR (US); Stephanie A Bojarski, Beaverton, OR (US); Achala Bhuwalka, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 808 days.

(21) Appl. No.: 16/354,669

(22) Filed: Mar. 15, 2019

(65) Prior Publication Data

US 2020/0295002 A1    Sep. 17, 2020

(51) Int. Cl.
*H01L 27/092*    (2006.01)
*H01L 29/78*    (2006.01)
(Continued)

(52) U.S. Cl.
CPC .... *H01L 27/0922* (2013.01); *H01L 21/02603* (2013.01); *H01L 21/3065* (2013.01); *H01L 21/3085* (2013.01); *H01L 21/3086* (2013.01); *H01L 21/30621* (2013.01); *H01L 21/8252* (2013.01); *H01L 21/823807* (2013.01); *H01L 21/823821* (2013.01); *H01L 27/0924* (2013.01);
(Continued)

(58) Field of Classification Search
CPC .......... H01L 27/0922; H01L 21/02603; H01L 21/30621; H01L 21/3065; H01L 21/3085; H01L 21/3086; H01L 21/823807; H01L 21/823821; H01L 21/8252; H01L 27/0924; H01L 29/0673; H01L 29/1037; H01L 29/16; H01L 29/20; H01L 29/42392; H01L 29/785; H01L 29/78696; H01L 21/823412; H01L 29/66795
USPC .................................................... 257/351
See application file for complete search history.

(56) References Cited

U.S. PATENT DOCUMENTS 10,141,311 B2    11/2018    Glass et al.
10,153,372 B2    12/2018    Cea et al.
(Continued)

*Primary Examiner* — Tong-Ho Kim
(74) *Attorney, Agent, or Firm* — Schwabe, Williamson & Wyatt, P.C.

(57) ABSTRACT

Techniques are disclosed for non-planar transistors having varying channel widths (Wsi). In some instances, the resulting structure has a fin (or nanowires, nanoribbons, or nanosheets) comprising a first channel region and a second channel region, with a source or drain region between the first channel region and the second channel region. The widths of the respective channel regions are independent of each other, e.g., a first width of the first channel region is different from a second width of the second channel region. The variation in width of a given fin structure may vary in a symmetric fashion or an asymmetric fashion. In an embodiment, a spacer-based forming approach is utilized that allows for abrupt changes in width along a given fin. Sub-resolution fin dimensions are achievable as well.

21 Claims, 19 Drawing Sheets

(51) Int. Cl.
*H01L 29/10* (2006.01)
*H01L 29/06* (2006.01)
*H01L 29/423* (2006.01)
*H01L 29/786* (2006.01)
*H01L 29/16* (2006.01)
*H01L 29/20* (2006.01)
*H01L 21/02* (2006.01)
*H01L 21/306* (2006.01)
*H01L 21/3065* (2006.01)
*H01L 21/308* (2006.01)
*H01L 21/8252* (2006.01)
*H01L 21/8238* (2006.01)

(52) U.S. Cl.
CPC ...... *H01L 29/0673* (2013.01); *H01L 29/1037* (2013.01); *H01L 29/16* (2013.01); *H01L 29/20* (2013.01); *H01L 29/42392* (2013.01); *H01L 29/785* (2013.01); *H01L 29/78696* (2013.01)

(56) References Cited

U.S. PATENT DOCUMENTS

| | | | |
|---|---|---|---|
| 2004/0110331 A1* | 6/2004 | Yeo | H01L 27/1211 257/E21.442 |
| 2010/0213548 A1 | 8/2010 | Chang et al. | |
| 2011/0278539 A1* | 11/2011 | Bangsaruntip | H01L 21/3247 257/14 |
| 2012/0180016 A1 | 7/2012 | Chidambaram et al. | |
| 2012/0258600 A1* | 10/2012 | Godet | H01L 21/2658 438/705 |
| 2013/0049136 A1 | 2/2013 | Wahl et al. | |
| 2013/0244392 A1 | 9/2013 | Oh et al. | |
| 2014/0001572 A1* | 1/2014 | Bohr | H01L 21/823431 438/424 |
| 2015/0137262 A1* | 5/2015 | Baek | H01L 27/0924 257/401 |
| 2016/0379982 A1* | 12/2016 | You | H01L 29/7846 257/369 |
| 2017/0077286 A1* | 3/2017 | Lo | H01L 29/1054 |

* cited by examiner

NON-PLANAR TRANSISTORS WITH CHANNEL REGIONS HAVING VARYING WIDTHS

BACKGROUND

A finFET is a transistor built around a thin strip of semiconductor material (generally referred to as the fin). The transistor includes the standard field-effect transistor (FET) nodes, including a gate, a gate dielectric, a source region, and a drain region. The conductive channel of the device resides on the outer sides of the fin beneath the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer regions of the fin, such a finFET design is sometimes referred to as a tri-gate transistor. FinFETs also include side-wall spacers, referred to generally as spacers, on either side of the gate that help determine the channel length and help with replacement gate processes. A nanowire transistor (or nanoribbon transistor or nanosheet transistor) is similar to a fin-based transistor, but the channel region comprises nanowires or nanoribbons or nanosheets instead of a finned channel region, for example. These configurations may be generally referred to as gate-all-around (GAA) configurations, as the gate wraps around the nanowires or nanoribbons or nanosheets. GAA transistors, finFET, etc. are examples of non-planar transistor configuration. There exists a number of non-trivial issues associated with non-planar transistors.

Figure 1A:
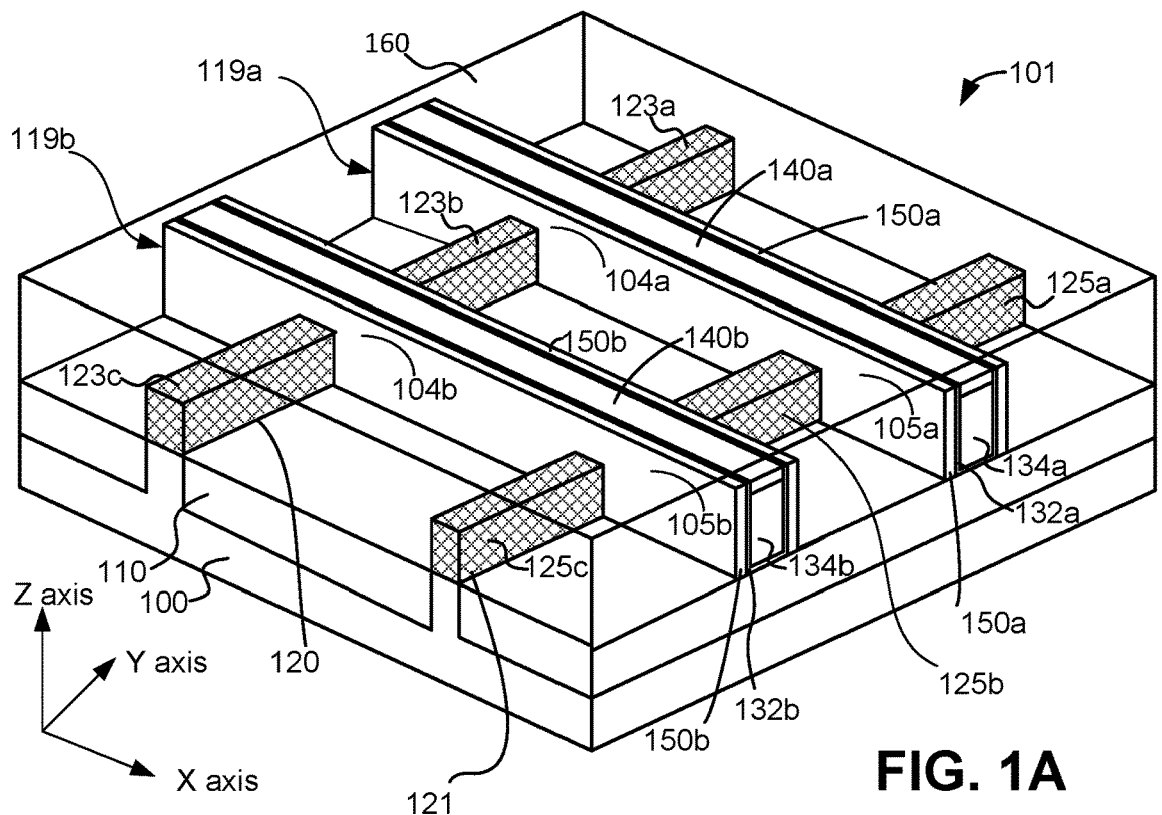
FIGS. 1A-1B illustrate perspective and top down views, respectively, of an example integrated circuit structure comprising finFET transistors having multiple fin widths, in accordance with an embodiment of the present disclosure.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed for forming channel regions in an integrated circuit having fin, nanoribbon, and/or nanowire transistor structures. Such techniques are particularly useful where various transistor structures have fins, nanowires, or nanoribbons of different widths. That is, the channel widths of the various transistor structures are different (i.e., channel width or fin width Wsi of various transistor structures are independent of each other, whether those transistor structures are on the same fin and/or neighboring fins). Thus, for example, a first channel region of a first transistor structure of a given fin may have a different width than that of a second channel region of a second transistor structure of that same fin, where the first and second channel regions comprise fins, nanowires, or nanoribbons. The fins, nanowires, or nanoribbons for the first and second channel regions may be formed during a same process flow. Such features allow formation of non-planar transistors with different channel widths (Wsi) on the same chip (substrate or die) or the same device. For example, techniques of the present disclosure may benefit an integrated circuit (IC) with various non-planar transistor structures, some of which are located in a first region of the IC and have a first channel width, and others located in a second region of the IC that have a second channel width that is different from the first channel width. Thus, the channel width of individual non-planar transistors may be tailored according to current capacity, rating, other appropriate characteristics, and/or design factors associated with the transistors, rather than being dictated by a global channel width for all the non-planar transistors in the IC or device.

The techniques for varying the channel width may be applicable to a wide range of transistor geometries and configurations, including but not limited to, various FinFET devices (e.g., tri-gate transistors, as well as gate-all-around devices such as nanowire, nanoribbon, or nanosheet transistors (depending on the aspect ratio of the wire, such that ribbons and sheets tend to be wider than they are tall), and/or any other type of non-planar transistor. As will be further explained herein, the varying widths may be implemented in a symmetrical fashion (where the variation in fin width is accomplished by changing both sides of a given fin) or in an asymmetrical fashion (where the variation in fin width is accomplished by changing one side of a given fin and allowing the opposite side of that fin to remain constant). Numerous variations and configurations will be apparent in light of this disclosure.

General Overview

As the fin (or nanowire) width used for finFET and other non-planar transistors scales, transistors become more sensitive to the channel width. Circuit design and other aspects may demand, merely as an example, a first transistor with a wider channel to be adjacent to a second transistor with a narrower channel, for example, to allow the first transistor to have a higher current rating than the second transistor. However, typically, multiple non-planar transistors on a specific region of an IC have similar channel widths, e.g., due to factors such as long-held processing standards and paradigms as well as limitations in techniques for formation of the fins or nanowires.

Various embodiments of this disclosure disclose adjacent non-planar transistors having different channel widths. Various embodiments of this disclosure disclose techniques for forming such varying channel width transistors.

For example, in some embodiments, a first channel region is on a first section of a fin and a second channel region is on a second section of the fin, where a first width of the first channel region is materially different from a second width of the second channel region. Thus, the channel width of individual non-planar transistors may be tailored according to current capacity, rating, and/or other appropriate design factors of the transistors, rather than being dictated by a global channel width for all the non-planar transistors in the IC or device (e.g., which are on a same fin). Note that materially different fin widths generally refers to an intentionally provisioned difference in fin width, such as the example case where the respective fin widths are more than 0.5 nm different, or more than 1 nm different, or more than 2 nm different, as measured at the same height on each fin). This is in contrast to variances in fin width that occur simply due to unintentional process variation caused by real world limitation of relevant processes.

Various techniques are discussed to form fins or nanowires having varying widths. In some embodiments, one or more hardmask structures resembling the final structure of one or more fins are first formed, and then the hardmask structures are transferred to a layer comprising the material of the fin to form the fins having varying widths. Thus, individual ones of the one or more hardmask structures have varying widths.

The one or more hardmask structures having varying widths may be formed using one of several techniques discussed herein. In one example embodiment, the hardmask structure is iteratively formed, where spacers on one or both sides of the hardmask structure are provisioned and selectively etched, and then additional spacer material is conformally deposited. The etching and conformal deposition can be repeated a number of times to have a corresponding number of widths in multiple sections of the hardmask structure. The resultant hardmask structure has varying width, as will be appreciated. The hardmask structure is then transferred to a layer comprising the material of the fin, e.g., to form the fin having varying widths.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, TEM can be useful to show a cross section of the device structure. In one example, such tools may indicate multiple finFET transistor structures (and/or nanowire and/or nanoribbon transistor structures), each having corresponding channel widths, where the channel widths of the channel regions are materially different. For example, the change of width may occur along relatively small length of a given fin, such as a variation in width of at least 0.5 nm, 1 nm, 2 nm, 5 nm, 10 nm, 12 nm, 15 nm, 20 nm, or the like, within a given length of fin. The resultant fin may be asymmetrical in an example case, where one side of the fin is planar or otherwise remains constant, and the opposite side of the fin has intentional recesses and/or protrusions, which results in the desired varying widths of the fin. In another example case, the resultant fin may be symmetrical, where one side of the fin is a mirror image of the opposite side. Note that perfect symmetry is not necessary, as will be appreciate. Such characteristics of the fin may be detected using any of the above discussed techniques (e.g., using TEM). In some embodiments, the techniques described herein may also be detected based on the benefits derived from their use, which includes different current carrying capacity of adjacent transistors formed from the same fin or adjacent fins. Numerous configurations and variations will be apparent in light of this disclosure.

As used herein, the term "nanowire" is not limited to structures of a particular cross-sectional shape, but includes structures of a rectangular, square, trapezoidal, "racetrack" (e.g., parallel sides connected by rounded ends), circular, oval, elongated, and other cross-sectional shapes that may manifest for a given fabrication process. Specifically, in accordance with some embodiments, a nanowire is a structure that has a thickness or diameter on the order of tens of nanometers or less, and an unconstrained length. A nanowire can be made of semiconducting material, a semiconducting metal oxide, a metal, or a carbon nanotube. Also, while some embodiments are discussed with reference to structures with nanowires, the present disclosure also applies to structures with nanoribbons and nanosheets, and to integrated circuits containing structures with both nanowires and nanoribbons/nanosheets.

Further note that the term "end" as used herein with respect to nanowires or nanoribbons need not be the absolute or terminal end of a given length. Rather, the end may simply refer to a portion of that nanowire/nanoribbon that includes a source or drain region. For instance, in cases where the source/drain region is continuous with the channel region, such as when the source/drain regions are doped portions of the multilayer structure from which the nanowires are formed, the "end" may refer to the portion of the nanowire/nanoribbon that includes the source/drain region as well as the region under the gate spacer (if a gate spacer if present). In other cases, such as in cases where the source/drain regions are replacement or epitaxial source/drain regions, the end may be the portion of the nanowire/nanoribbon within the gate spacer and/or between the source/drain region and the channel region.

As discussed herein, terms referencing direction, such as upward, downward, vertical, horizontal, left, right, front, back, etc., are used for convenience to describe embodiments of integrated circuits having a base or substrate extending in a horizontal plane. Embodiments of the present disclosure are not limited by these directional references and it is contemplated that integrated circuits and device structures in accordance with the present disclosure can be used in any orientation.

The use of "group IV semiconductor material" (or "group IV material" or generally, "group IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Architecture and Methodology

Figure 1B:
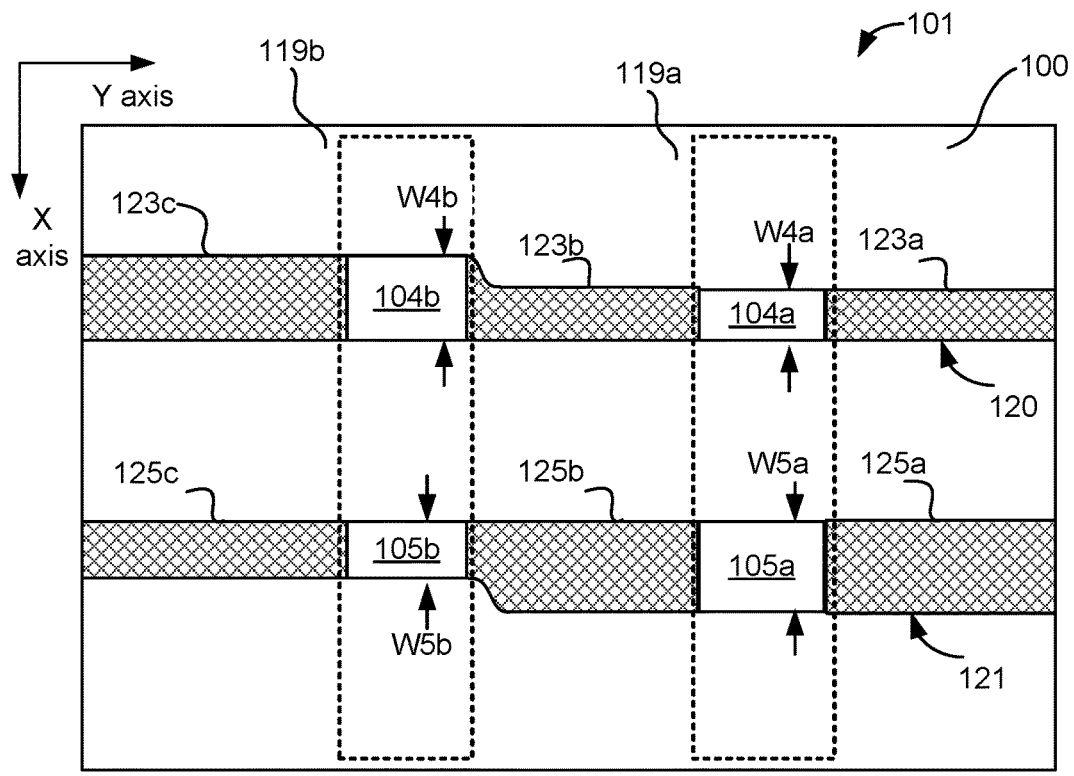

FIGS. 1A-B collectively illustrate an example integrated circuit structure 101 comprising finFET transistors having multiple fin widths, in accordance with an embodiment of the present disclosure. In FIG. 1A, a perspective view of integrated circuit structure 101 is illustrated in the X, Y, and Z plane. FIG. 1B illustrates a top down view of the integrated circuit structure 101, e.g., in the X-Y plane. For purposes of illustrative clarity, several components are not illustrated in FIG. 1B, as will be discussed in further details herein.

As can be seen, in this example embodiment, the integrated circuit structure 101 (also referred to as "structure 101") of FIG. 1A includes substrate 100 including multiple fin structures formed therefrom (or thereon, as the case may be), shallow trench isolation (STI) material 110 between the fin structures, and two gate stacks 119a and 119b. For example, a first gate stack 119a comprises gate dielectric 132a and gate electrode 134a. A hardmask layer 140a is formed over the gate stack 119a, and side-wall spacers 150a are formed on either side of the gate stack 119a. A second gate stack 119b comprises gate dielectric 132b and gate electrode 134b. A hardmask layer 140b is formed over the gate stack 119b, and side-wall spacers 150b are formed on either side of the gate stack 119b. Although FIG. 1A illustrates merely two gate stacks, the structure 101 may include any appropriate number of gate stacks (e.g., one, three, four, or higher, depending on the end use or target application). The gate stacks may also be referred to herein as gate structures.

An insulating material layer 160 is formed over the structure 101. Note that the insulator layer 160 is shown as transparent throughout many figures, including FIG. 1A, to allow for the underlying structure to be seen. Furthermore, in FIG. 1B, insulator layer 160 is not illustrated for purposes of illustrative clarity.

The example integrated circuit structure 101 includes two multi-width fins 120 and 121. As illustrated in both the perspective view of FIG. 1A and the top view of FIG. 1B, each of the fins 120, 121 has varying widths along its length. Note that the shape and width of the fins in the embodiment of FIGS. 1A and 1B are mere examples, and the present disclosure is not intended to be limited to just the shapes/widths shown, because any number of other multi-width fin profiles can be fabricated using the techniques provided herein. Further note that although merely two fins are shown on the example integrated circuit 101 of FIGS. 1A-B, any number of fins may be formed, such as one, three, five, ten, hundreds, thousands, millions, etc., depending on the end use or target application.

In some embodiments, the multi-width fins 120 and 121 are native to the substrate 100 (i.e., the multi-width fins 120 and 121 are made from and part of the substrate 100), but in other embodiments may be compositionally different from the underlying substrate (e.g., germanium or SiGe multi-width fins 120 and 121 on a silicon or GaAs substrate 100). In some such embodiments, the compositionally different multi-width fins 120 and 121 will ultimately include channel regions 104a-b and 105a-b that are epitaxially grown from multi-width trenches that result from removal of sacrificial multi-width fins, in a so-called aspect ratio trapping (ART) based fin forming process. Example ART-based semiconductor fin forming techniques are provided, for instance, in U.S. Patent Application Publication 2014/0027860. In some such ART-based cases, the replacement fin material is provided as alternating layers of desired channel material and sacrificial/inactive material such as described in U.S. Patent Application Publication 2016/0260802. Such multilayer fins are particularly useful for forming nanowire transistors (e.g., during final gate processing, prior to deposition of final gate materials). In some ART-based cases, a first set of multi-width fins or wires is formed with a first semiconductor material system (e.g., for p-type devices), and a second set of multi-width fins or wires is formed with a second semiconductor material system (e.g., for n-type devices). Further note that, in some embodiments, there may be a mix of native fins (e.g., multi-width fin 120) and replacement fins (e.g., multi-width fin 121). In addition, or alternatively, some of the fins may be bulk fins (e.g., multi-width fin 120) while other fins may be multilayer fins (e.g., multi-width fin 121) suitable for forming nanowires (or nanoribbons or nanosheets). Any number of fin types and fin forming processes can be used in the context of the present disclosure, where the fin width varies along the length of the fin.

The fin 120 has a first channel region 104a defined by the gate stack 119a as well as source/drain (S/D) regions 123a, 123b adjacent to the channel region 104a. The fin 120 has a second channel region 104b defined by the gate stack 119b as well as S/D regions 123b, 123c adjacent to the channel region 104b.

The fin 121 has a first channel region 105a defined by the gate stack 119a as well as S/D regions 125a, 125b adjacent to the channel region 105a. The fin 121 has a second channel region 105b defined by the gate stack 119b as well as S/D regions 125b, 125c adjacent to the channel region 105b.

The channel regions 104a, 104b, 105a, 105b cannot be seen in FIG. 1A, as these are covered by the respective gate stacks—hence, the channel regions 104a, 104b, 105a, 105b are symbolically depicted simply with reference labels in FIG. 1A. In FIG. 1B, however, the gate stacks 119a, 119b are shown as transparent boxes with dotted lines for illustrative purposes—hence, the channel regions 104a, 104b, 105a, 105b underneath the respective gate stacks are visible in FIG. 1B. Thus, the structure 101 comprises four finFET transistors. A first transistor (e.g., a finFET transistor) comprises the gate stack 119a, the channel region 104a of the fin 120, and the S/D regions 123a, 123b. A second transistor comprises the gate stack 119b, the channel region 104b of the fin 120, and the S/D regions 123b, 123c. A third transistor comprises the gate stack 119a, the channel region 105a of the fin 121, and the S/D regions 125a, 125b. A fourth transistor comprises the gate stack 119b, the channel region 105b of the fin 121, and the S/D regions 125b, 125c. In an example, either of the S/D regions in a pair may be the source while the other is the drain, which may be determined based on the electrical connections made to the regions. For example, in some cases, region 123a may be used as the source and region 123b may be used as the drain for the first transistor, or vice versa, depending on the desired configuration. In other embodiments, and as will be discussed in turn with reference to FIGS. 18A-B, one or more of the channel regions may be configured with nanowires, nanoribbons, or nanosheets, where the corresponding gate structure wraps around the nanowires, nanoribbons, or nanosheets, to provide a gate-all-around transistor.

Note that the semiconductor material making up a fin, nanowire, nanoribbon, nanosheet, channel region, source region, or drain region may be referred to herein as a body comprising semiconductor material. Further note that the use herein of expressions such as "channel region" or "channel structure" or "source region" or "source structure" or "drain region" or "drain structure" simply refers to specific locations of an overall transistor structure, and is not intended to imply that the transistor is currently electrically biased or otherwise in a conductive state where carriers are mobile within the channel region, as will be plainly apparent and appreciated. For instance, a given transistor need not be connected (whether directly or indirectly) to any power source whatsoever to have a channel region or a channel structure, or source and drain regions or structures.

In some embodiments, substrate 100 may be: a bulk substrate including, e.g., Si, SiGe, Ge, and/or at least one III-V material; an X on insulator (XOI) structure where X is a semiconductor material such as Si, SiGe, Ge, and/or at least one III-V material, and the buried insulator material is an oxide material or dielectric material or some other electrically insulating material; or some other suitable multilayer substrate structure where the top layer includes a semiconductor material such as Si, SiGe, Ge, and/or at least one III-V material. In the example embodiment of FIG. 1A-B, the channel region of the fins can be native to substrate 100, but in other embodiments may be replacement material, as previously explained. The formation of the fins may have included any suitable techniques, e.g., some of which will be discussed herein in further details.

In some embodiments and as illustrated in FIG. 1A, STI regions (or isolation regions) 110 may be formed between sub-fin portions as shown to, for example, prevent or minimize electric current leakage between the adjacent semiconductor devices formed from the fins. STI material 110 may include any suitable insulating material, such as one or more dielectric, oxide (e.g., silicon dioxide), or nitride (e.g., silicon nitride) materials. In some embodiments, the STI material 110 may be selected based on the material of substrate 100 (which may also be the material of the sub-fin portions native to the substrate). For example, in the case of a Si substrate 100, STI material 110 may selected to be silicon dioxide or silicon nitride. In addition, in this example embodiment, insulator layer 160 may be formed using any suitable techniques and any suitable material, such as blanket depositing a low-k dielectric material on the underlying structure (followed by an optional planarization process). Such insulator materials include, for example, oxides such as silicon dioxide and carbon doped oxide, nitrides such as silicon nitride, organic polymers such as perfluorocyclobutane or polytetrafluoroethylene, fluorosilicate glass, and organosilicates such as silsesquioxane or siloxane or organosilicate glass. In some embodiments, insulator layer 160 may include pores or other voids to further reduce the dielectric constant of the layer.

As previously explained, the integrated circuit structure 101 includes gate stack 119a, 119b, including gate dielectric 132a, 132b formed to define respective fin channel regions. The gate stacks 119a, 119b also include respective gate electrodes 134a, 134b formed on the respective gate dielectric 132a, 132b. As can also be seen in this example embodiment, the integrated circuit structure includes hardmask 140a, 140b over respective gate electrode 134a, 134b, side wall spacers 150a on either side of the gate stack 119a, and side wall spacers 150b on either side of the gate stack 119b. The gate dielectric and gate electrode may be formed using any suitable techniques. For example, in some embodiments that employ a so-called gate-last or remove metal gate (RMG) process, the formation of the gate stack may include dummy gate oxide deposition, dummy gate electrode (e.g., poly-Si) deposition, and patterning hardmask deposition. Additional processing continues with patterning the dummy gates and depositing/etching spacer material. Following such processes, the method may continue with insulator deposition, planarization, and then eventually (after source/drain processing) dummy gate electrode and gate oxide removal to expose the channel region of the transistors. Following opening the channel region, the dummy gate oxide and electrode may be replaced with, for example, a high-k dielectric and a replacement metal gate, respectively. Other embodiments may include a standard gate stack formed by any suitable process. In this example embodiment, the gate shown is an RMG, where a dummy gate was used to facilitate formation of the replacement gate after the rigors of source/drain processing have been carried out, so as to better preserve the quality of the final gate materials as well as the interface between the channel region and final gate stacks 119a, 119b. In still other example embodiments, a gate-first process is used wherein the initial gate materials provisioned are the final gate materials. To this end, either gate-first or gate-last processes may be used.

In some embodiments, the gate dielectric 132a, 132b may be, for example, any suitable oxide material (such as silicon dioxide) and/or a high-k gate dielectric material. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of each of the gate dielectric 132a, 132b should be sufficient to electrically isolate the gate electrode from the source and drain contacts. In some embodiments, the gate dielectric may have a thickness of 0.5 to 3 nm, or any other suitable thickness, depending on the end use or target application. In some embodiments, the gate dielectric 132a, 132b may include a multilayer structure of two or more material layers or components. For instance, in one such embodiment, the gate dielectric 132a, 132b is a bi-layer structure having a first dielectric material (e.g., silicon dioxide) in contact with the channel region and a second dielectric material (e.g., hafnium oxide) in contact with the first dielectric material, the first dielectric material having a dielectric constant that is lower than the dielectric constant of the second dielectric material.

In some embodiments, the gate electrodes 134a, 134b may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In embodiments where gate electrodes 134a, 134b include metal, the metal gate electrodes can be variable workfunction (e.g., to assist with tuning to the proper threshold voltage of the device). Like the gate dielectric 132a, 132b, the gate electrodes 134a, 134b may include a multilayer structure of two or more material layers or components. For example, in one such example case, the gate electrodes 134a, 134b include a central metal plug portion (e.g., tungsten) with one or more outer work function layers and/or barrier layers (e.g., tantalum, tantalum nitride), and/or a resistance reducing cap structure (e.g., copper, gold, boron), and/or an insulating cap structure (e.g., silicon nitride and/or silicon oxide, or an oxynitride).

In this example embodiment, hardmask layers 140a, 140b are present to provide benefits during processing, such as protecting the respective gate electrodes 134a, 134b from processes performed after the deposition of the gate electrode material (e.g., ion implantation processes or source/drain etch-and-replace processing). Hardmask layers 140a, 140b may be formed using any suitable techniques and may include any suitable materials, such as silicon dioxide or silicon nitride, for example. Note that in some embodiments, hardmask layers 140a, 140b may not be present or may be at least partially removed during subsequent processing to allow for making contact with the respective gate electrodes 134a, 134b, for example.

In this example embodiment, side wall spacers 150a, 150b (also referred to as gate spacers, or simply, spacers) are formed adjacent to the respective gate stacks 119a, 119b, and may have been formed to assist with the replacement gate process, for example. Spacers 150a, 150b may be formed using any suitable techniques and may include any suitable materials, such as silicon oxide or silicon nitride, for example. The width of spacers 150 may be selected as desired, depending on the end use or target application.

As will be further appreciated, the configuration of the various source/drain regions 123a-c and 125a-c can vary from one embodiment to the next. In some example embodiments, the source/drain regions 123a-c and 125a-c are dopant-implanted portions of the corresponding fin structure. In other embodiments, the source/drain regions 123a-c and 125a-c are epitaxial replacement source/drain regions, wherein the original corresponding portion of the fin is removed and replaced with a desired source/drain material. This option of epitaxial replacement source/drain regions is generally depicted in the figures with cross-hatching in the source/drain regions. The source/drain regions 123a-c and 125a-c may be raised so as to be taller than the channel region, and/or faceted (depending on the forming process used), and/or may extend under the gate structure, such as under the gate spacer (when present) and/or under both the gate electrode. In some such cases where the source/drain regions are formed with an etch-and-replace process, a bottom portion of the epitaxial source/drain regions may have a width that corresponds to the original fin width, and a top portion of the epitaxial source/drain regions may have a wider width that extends above (or is otherwise raised) the original fin and is wider than the original fin width. In other such embodiments, any excess epitaxial source/drain material is removed during a planarization process that sets the source/drain region height to the top surface of the fin. In any such cases, the source/drain regions 123a-c and 125a-c can be p-type doped and/or n-type doped. Any combination of these various S/D features may be used in a given embodiment.

In the example embodiment shown, the S/D regions 123a-c and 125a-c extend underneath spacers 150a, 150b, as the gate stacks effectively define channel regions. For example, sections of the S/D regions 123c, 125c, 123b, 125b are underneath respective sections of the spacers 150b surrounding the gate stack 119b. Similarly, sections of the S/D regions 123b, 125b, 123a, 125a are underneath respective sections of the spacers 150a surrounding the gate stack 119a.

As will be appreciated, the doping of the S/D regions and the channel regions can be selected based on the desired transistor configuration. For example, for a p-type MOS (p-MOS) transistor, the S/D regions 123a-c may be p-type doped and the corresponding channel regions 104a-b may be n-type doped (or undoped). In another example, for an n-type MOS (n-MOS) transistor 125a-c, the S/D regions may be n-type doped and the corresponding channel regions 105a-b may be p-type doped (or undoped). In some embodiments, both p-MOS and n-MOS devices may be included to form a CMOS device, for example. In some such cases, the p-MOS and n-MOS devices are formed on the same fin, while in other cases the p-MOS and n-MOS devices are formed on neighboring fins, while still other cases may include a mix of such features. In another example, for a tunnel field-effect transistor (TFET), the source may be p-type or n-type doped, the drain may be doped with an opposite polarity from the source (e.g., n-type doped when the source is p-type doped), and the channel may be undoped or intrinsic. In some embodiments, both p-TFET and n-TFET device may be included to form a complementary TFET (CTFET) device. Example transistor geometries that can benefit from the techniques described herein include, but are not limited to, field-effect transistors (FETs), metal-oxide-semiconductor FETs (MOSFETs), tunnel-FETs (TFETs), planar configurations, finned configurations (e.g., fin-FET, tri-gate), and nanowire (or nanoribbon or gate-all-around) configurations. Numerous variations and configurations will be apparent in light of the present disclosure.

Referring now to FIG. 1B, in an example, a width of individual fins 120, 121 varies over the length of the fin. As will be appreciated, width Wsi of a fin is along a direction that is perpendicular to the fin. For example, in FIGS. 1A-1B, the fin 120 extends in the direction of the Y axis, and the width Wsi is along the direction of the X axis. So, for instance, for the fin 120, the width of the fin 120 is perpendicular to an imaginary line passing though the S/D regions 123a, 123b, 123c. In a similar fashion, for the fin 121, the width of the fin 121 is perpendicular to an imaginary line passing though the S/D regions 125a, 125b, 125c.

As further best illustrated in FIG. 1B, the width Wsi of the fin 120 varies along a length of the fin 120, and the width Wsi of the fin 121 varies along a length of the fin 121. The widths illustrated in FIG. 1B are merely examples, and do not limit the scope of this disclosure. For example, the fin 120 has a first width of W4b at or near the channel region 104b, and has a second width of W4a at or near the channel region 104a. The fin 121 has a first width of W5b at or near the channel region 105b, and has a second width of W5a at or near the channel region 105a. In one such example, the width W4b is different from W4a, and the width W5b is different from W5a, e.g., as will be further discussed herein with respect to FIG. 2. In other embodiments, the fin width of the two neighboring fins shown may vary in a symmetrical fashion or otherwise track from fin to fin. Numerous fin width variance schemes can be used, as will be appreciated.

Figure 2:
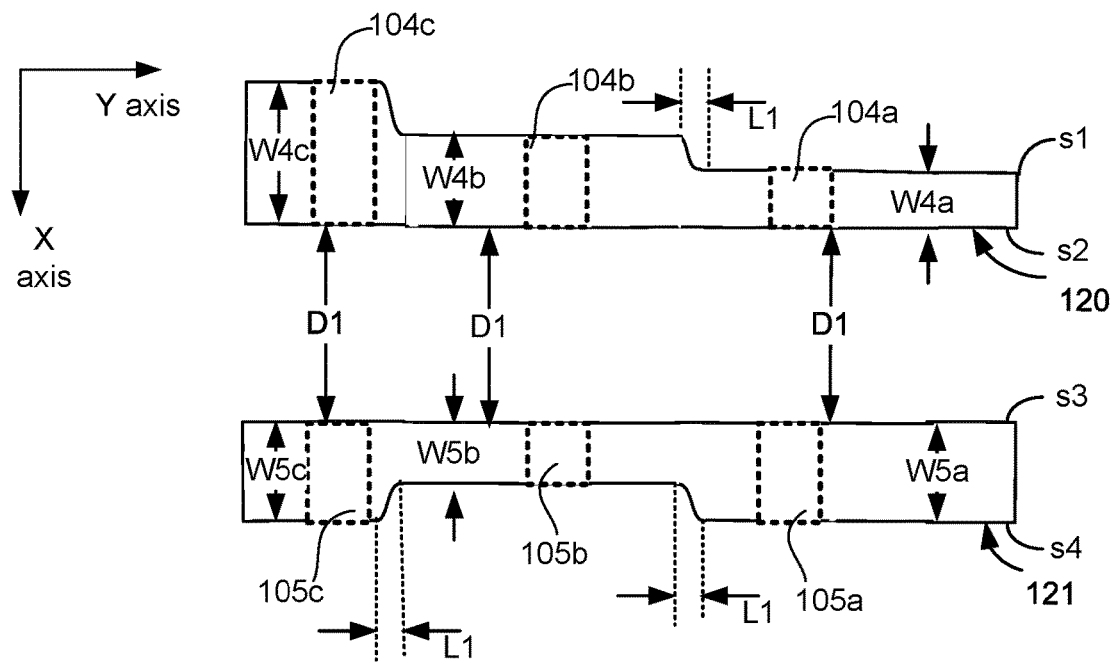
FIG. 2 illustrates example variation of widths of fins on a common substrate, in accordance with an embodiment of the present disclosure.

In FIG. 1B, merely two example variations of width each of the fins 120, 121 are illustrated, although there may be higher number of variations of width of each of the fins 120, 121 may be possible. For example, FIG. 2 illustrates example variation of widths of fins 120, 121 of FIGS. 1A-1B, in accordance with another example embodiment of the present disclosure. As can be seen in FIG. 2, the fins 120, 121 are illustrated without any shading. For example, the fins 120, 121 illustrated in FIG. 2 are prior to the formation of the S/D regions on the fins. As can further be seen in the example of FIG. 2, the fin 120 has three different widths W4a, W4b, W4c, and the fin 121 has three different widths W5a, W5b, W5c. As discussed herein earlier, the width of the fin, at a specific section of the fin, is along a direction that is perpendicular to the fin. Merely as an example, and with further reference to FIG. 2, the channel region 104a comprises a section of the fin 120 having a first width W4a, the channel region 104b comprises a section of the fin 120 having a second width W4b, and another channel region 104c comprises a section of the fin 120 having a third width W4c. Similarly, the channel region 105a comprises a section of the fin 121 having a first width W5a, the channel region 105b comprises a section of the fin 121 having a second width W5b, and another channel region 105c comprises a section of the fin 121 having a third width W5c.

In other embodiments, fin 120 might have two to three different widths, and the fin 121 might have four to six different widths, or vice-versa. According to one embodiment, some fins in a given section of the die may all have the same multi-width profile and end-to-end orientation, while in other embodiments the fins of a given section of the die may have the same multi-width profile but an opposite end-to-end orientation (e.g., odd fins are oriented in a left-to-right fashion, and even fins are oriented in a right-to-left fashion). In still other embodiments, the multi-width profile of a first group of fins on a given die is independent from the multi-width profile of a second group of fins on that die, whether in the same section of the die (e.g., both first and second groups are in a logic or I/O section of the die) or in different sections of the die (e.g. first group is in a logic section of the die and the second group is in a power section of the die). In a more general sense, any fin may be formed with any number of different widths so as to provide a desired multi-width profile.

With further reference to FIG. 2, the fin 120 has a side s1 and an opposite side s2, where the side faces the fin 121. The fin 121 has a side s3 and an opposite side s4, where the side s3 faces the fin 120.

In the example of FIGS. 1B and 2, note that the individual fins are asymmetrical, both with respect to themselves and each other. For example, and with respect to symmetry of the individual fins themselves, the profile of the side s1 of the fin 120 is different from that of the side s2, and the profile of the side s3 of the fin 121 is different from that of the side s4. For example, the variation of the width of the fin 120 is due to variation in the side s1, and the variation of the width of the fin 121 is due to variation in the side s4. For example, the side s1 of the fin 120 has recesses and/or protrusions, while the side s2 is relatively flat or planar or linear or otherwise remains constant. Similarly, the side s4 of the fin 121 has recesses and/or protrusions, while the side s3 is relatively flat or planar or linear or otherwise remains constant. Moreover, and with respect to symmetry of the fins 120 and 121 relative to each other, they each have different multi-width asymmetric profiles. In other embodiments, the fins 120 and 121 have the same multi-width asymmetric profile. In some such cases, the multi-width asymmetric profiles are oriented in the same direction, so as to mirror each other (e.g., width a of fin 120 is directly across from width a of fin 121, width b of fin 120 is directly across from width b of fin 121, etc). In other such cases the multi-width asymmetric profiles are oriented in the opposite direction (e.g., width a of fin 120 is directly across from width c of fin 121, width b of fin 120 is directly across from width b of fin 121, and width c of fin 120 is directly across from width a of fin 121).

With further reference to FIG. 2, note that each channel regions 104a, 104b, 104c formed from the fin 120 will have their respective sides s2 substantially aligned (e.g., the side s2 of the channel regions 104a, 104b, 104c is relatively straight or otherwise constant and thus may be misaligned by at most 0.5 nm, or some other relatively minor nonlinearity attributable to unintentional process variation or real-word process limitations). Also, further note that each of channel regions 105a, 105b, 105c formed from the fin 121 will have their respective sides s3 substantially aligned (e.g., the side s3 of the channel regions 105a, 105b, 105c is relatively straight or otherwise constant and thus may be misaligned by at most 0.5 nm, or some other relatively minor nonlinearity attributable to unintentional process variation or real-word process limitations).

In an example, a lateral distance between the side s2 of the fin 120 and the side s3 of the of the fin 121 is substantially constant (e.g., lateral distance D1) along a length of the fins 120, 121. For example, the distance D1 between the two sides s2 and s3, along the length of the fins 120, 121, varies at most by 0.2 nm, 0.5 nm, 1 nm, 2 nm, or some other relatively minor deviation attributable to unintentional process variation or real-word process limitations. In an example, the channel regions 104a, 104b, 104c has sides s1 and s2, and the channel channels 105a, 105b, 105c has sides s3 and s4. As discussed, the distance between side s2 of channel 104a and side s3 of channel 105b is D1, the distance between side s2 of channel 104b and side s3 of channel 105b is D1, and the distance between side s2 of channel 104c and side s3 of channel 105c is D1. In an example, a lateral distance between side s1 of channel 104a and side s4 of channel 105a (i.e., D1+W5a+W4a) may be substantially different (e.g., differs by more than 4 nm, 6 nm, 8 nm, or 10 nm, for example) from a lateral distance between side s1 of channel 104b and side s4 of channel 105b (i.e., D1+W5b+W4b) and/or from a lateral distance between side s1 of channel 104c and side s4 of channel 105c (i.e., D1+W4c+W5c).

The widths W4a, W4b, W4c of the fin 120 are different. For example, width W4a differs from width W4b (and/or from width W4c) by more than 3 nm, 7 nm, 8 nm, 10 nm, 15 nm, 20 nm, 40 nm, or the like. The widths W5a, W5b, W5c are different. For example, width W5a differs from width W5b (and/or from width W5c) by more than 3 nm, 7 nm, 8 nm, 10 nm, 15 nm, 20 nm, 40 nm, or the like. In an example, width W4c is at least 30%, 60%, 80%, 100%, 150%, 200%, or 300% of the width W4b (and/or width W4a). In an example, width W4c is at least 1.2 times (×), 1.5×, 3×, 4×, 5×, 10×, 20×, or some other multiple of width W4b (and/or W4c). In an example, width W4a is less than 10 nm, 8 nm, 7 nm, or 5 nm, and width W4b is more than 10 nm, 12 nm, or 15 nm, and width W4c is more than 15 nm, 18 nm, or 20 nm, for example. Similar dimensions may apply for the fin 121 as well.

A narrowest of the widths of the fins 120, 121 along the length of the fins 120, 121 (e.g., a smallest of the widths W4a, W4b, W4c, W5a, W5b, or W5c) is less than 20 nm, 10 nm, 8 nm, 7 nm, or 5 nm, for example.

In an example, a transition of a fin (e.g., fin 120) from a first width (e.g., width W4b) to an adjacent second width (e.g., width W4a) may occur relatively abruptly or sharply, given the techniques disclosed herein. For instance, transition from width W4b to width W4a may occur within a length L1 of the fin, e.g., as illustrated in FIG. 2. In an example, L1 may be at most 0.5 nm, 1 nm, 2 nm, or 3 nm. In other embodiments, the transition may be less abrupt and occur over a longer distance (e.g., 5 nm, or 10 nm, depending on various factors such as the precision of the patterning used (as will be discussed in turn) and the height of the fins, as will be appreciated in light of this disclosure. In an example, the corners at the transition region of the fins (e.g., where the fins change the widths) may be relatively sharp, e.g., within 5 degrees of 90 degrees, within 10 degrees of 90 degrees, etc.

Thus, the varying width of the fins 120, 121 results in channel regions having different widths. Thus, channel region widths may be varied in the same integrated circuit structure 101, e.g., based on the application of the associated transistor of a given die. Thus, the channel width of individual non-planar transistors along a given fin structure may be tailored according to current capacity, rating, and/or other appropriate design factors associated with the transistors, rather than being dictated by a regional or global channel width for all the non-planar transistors in the IC or device. As will be appreciated, the techniques provided herein allow for spot-based fin width tuning.

Figure 3:
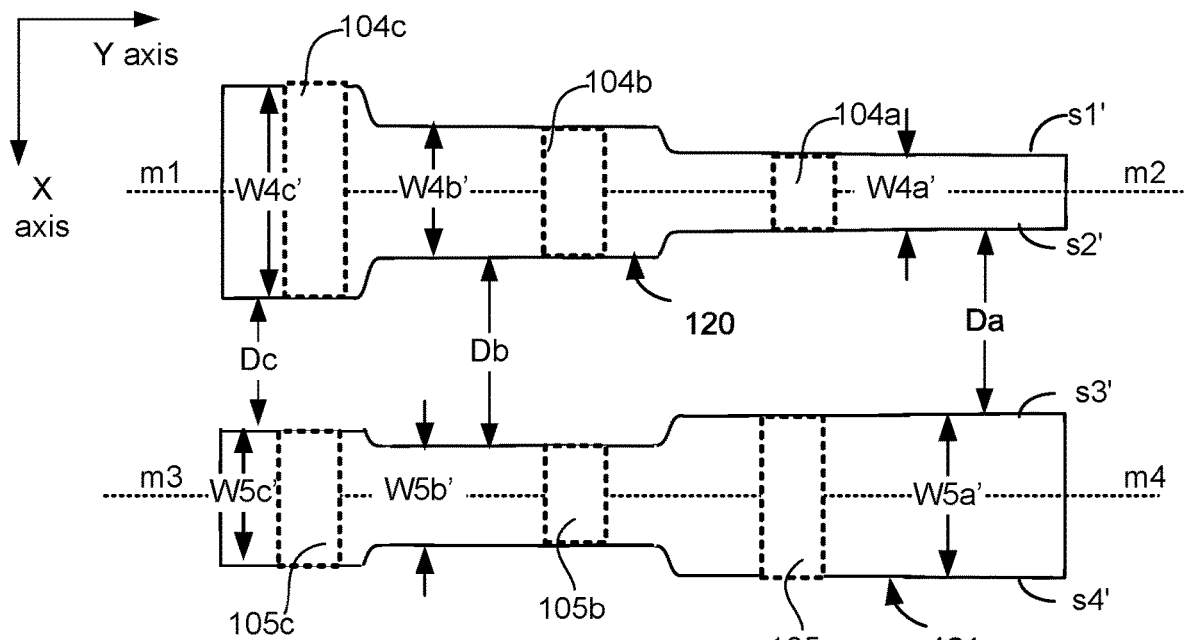
FIG. 3 illustrates another example variation of widths of fins on a common substrate, in accordance with an embodiment of the present disclosure.

FIG. 3 illustrates other example variation of widths of fins 120, 121, in accordance with an embodiment of the present disclosure. Unlike FIG. 2, in FIG. 3 individual ones of the fins 120, 121 are each symmetrical about an axis. For example, fin 120 has two opposing sides s1' and s2'. As can be seen, the sides s1' and s2' are substantially symmetrical with respect to each other, about an axis designated with an imaginary line m1-m2 passing through a center region of the fin 120. The fin 120 is substantially symmetrical about this axis (e.g., asymmetrical by at most 0.5 nm, 1 nm, or 2 nm, or some other relatively minor deviation attributable to unintentional process variation or real-word process limitations). For example, the side s1' is a substantial mirror image of the side s2', about axis line m1-m2. Similarly, the fin 121 is substantially symmetrical about imaginary axis line m3-m4.

Merely as an example, the fin 120 of FIG. 3 has widths W4a', W4b', and W4c'. Assume the first channel region 104a formed on a section of the fin 120 having width W4a', the second channel region 104b formed on a section of the fin 120 having width W4b', and the third channel region 104c formed on a section of the fin 120 having width W4c'. Thus, in such a case, the three channel regions are substantially aligned (e.g., a line running through the center of the first channel region along a length of the fin will also pass through the center of the second and third channel regions along the length of the fin). Put differently, the line m1-m2 will run substantially through the center of the three channel regions along the length of the fin 120 (e.g., the line m1-m2 will differ by at most 0.5 nm, or 1 nm from the center of the three channel regions). Similarly, the respective centers of channel regions 105a, 105b, 105c on the fin 121 will also be substantially aligned.

Furthermore, the channel region 104a is at a lateral distance of Da from the adjacent channel region 105a; the channel region 104b is at a lateral distance of Db from the adjacent channel region 105b; and the channel region 104c is at a lateral distance of Dc from the adjacent channel region 105c, as illustrated in FIG. 3. The distances Da and Db (and/or the distances Da and Dc, and/or the distances Db and Dc) may intentionally differ by more than 2 nm, 5 nm, or 10 nm, for example.

FIGS. 4A, 4B, 4C, 4D, 5A, 5B, 5C, 6A, 6B, 6C, 7, 8, 9A, 9B, 9C, 10A, 10B, 10C, 11A, 11B, and 11C collectively illustrate a method for making fins for a transistor, where individual ones of the fins have varying width and are asymmetrical, in accordance with an embodiment of the present disclosure. For example, the method can be used to make the asymmetrical fins 120, 121 of FIG. 2, or asymmetrical fins of any other non-planar transistor structures that will be apparent in light of this disclosure.

Figure 4A:
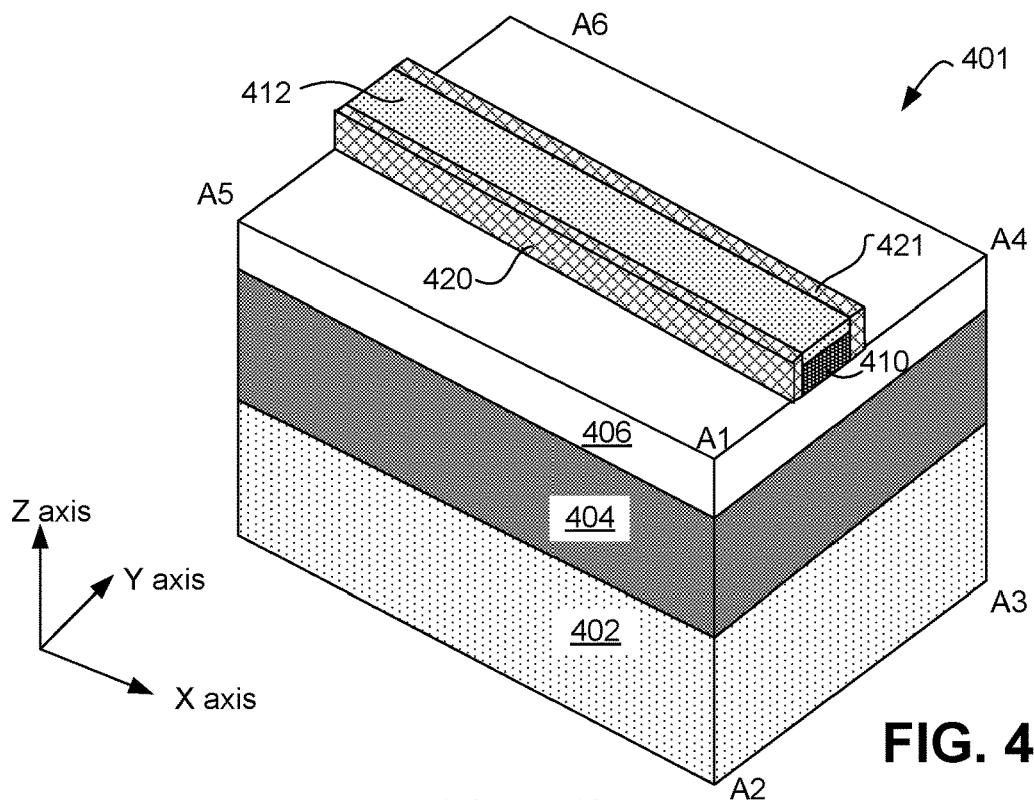
FIGS. 4A, 4B, 4C, 4D, 5A, 5B, 5C, 6A, 6B, 6C, 7, 8, 9A, 9B, 9C, 10A, 10B, 10C, 11A, 11B, 11C, 11D, 11E, and 11F collectively illustrate example methods for making fins for non-planar transistors, where individual ones of the fins have varying width and are asymmetrical, in accordance with some embodiments of the present disclosure.
Figure 4B:
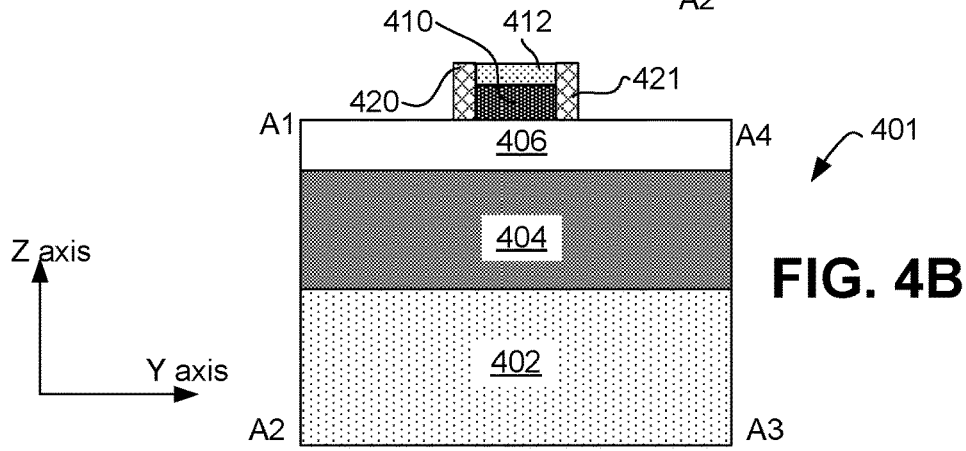
Figure 4C:
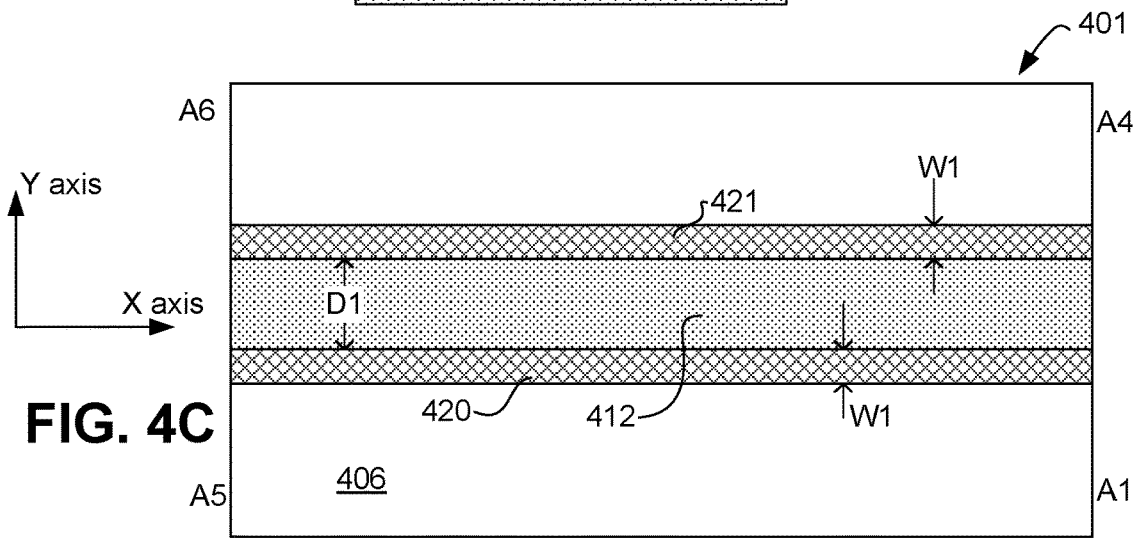

FIGS. 4A, 4B, 4C illustrate a structure for forming fins with varying widths, in accordance with an embodiment of the present disclosure. FIG. 4A is a perspective view of the structure 401. Six corners A1, A2, A3, A4, A5, and A6 of the structure 401 are illustrated in FIG. 4A. FIG. 4B is a side view of the structure 401, shown along the plane of A1, A2, A3, and A4. FIG. 4C is a top view of the structure 401, shown along the plane of A1, A4, A6, and A5.

Referring to FIGS. 4A-4C, the structure 401 comprises a layer or structure 402. As will be discussed herein later, the layer 402 may be used to form the fins (e.g., fins 120, 121), and accordingly, the material of the layer 402 may be the material used for the fins 120, 121, e.g., as discussed with respect to FIG. 1A. Although not illustrated, in some embodiments, the layer 402 may be over or otherwise part of a substrate, such as the substrate 100 of FIG. 1A, or over a buried insulator layer in a semiconductor-on-insulator configuration.

Recall that, in some example embodiments, layer 402 is used to form multi-width placeholder fins that are subsequently etched out and replaced with so-called ART-based fins or epitaxial replacement fins that take on the same multi-width profile of the placeholder fins subsequently formed in the layer 402. So, one of more of the fins formed in layer 402 may be multi-width fins that can be used to form transistors and/or one or more of the fins formed in layer 402 may be multi-width placeholder fins that are etched out and replaced with a desired channel material to provide the multi-width fins that can be used to form transistors, according to some embodiments.

Further recall that in some embodiments, layer 402 is a multilayer structure that includes two or more alternating layers of active channel material and sacrificial material. Such multilayer structures can be used for forming nanowires, nanoribbons, or nanosheets. For instance, in some such example cases, the sacrificial material can be exposed and selectively removed during a subsequent gate forming process so as to liberate or release one or more wires (or ribbons or sheets, as the case may be) comprising the active channel material. Further note that the active channel material for p-type devices may be the sacrificial material for n-type devices, and vice-versa.

One or more layers comprising hardmask material, such as layers 404 and 406, may be above the layer 402. Hardmask layers 404, 406 may be formed using any suitable techniques and may include any suitable materials, such as silicon dioxide, silicon nitride, titanium nitride, for example. In an example, although two hardmask layers 404, 406 are illustrated, the structure 401 may have one, three or more hardmask layers. Layers 410 and 412 are formed above the layer 406. For example, layer 410 is on the layer 406, and layer 412 masks the layer 410. The layer 410 may include any appropriate sacrificial material (e.g., an oxide such as $SiO_2$), and the layer 412 may include hardmask material (e.g., a nitride, such as $Si_3N_4$). In an example, the layers 412 and 406 may be selected such that these two layers have etch selectivity with respect to each other, and also with respect to subsequently deposited spacer material, as will be explained and apparent in turn. Also note that being able to selectively etch a first material relative to a second material includes being able to use a process that removes the first material at least 1.5, 2, 3, 5, 10, 20, 50, or 100 times faster than that same process removes the second material, or at least some other relative amount. Accordingly, the selective etch processes may include various etchants, temperatures, pressures, etc. as desired to enable the desired selectivity of the process.

In some embodiments and as illustrated in FIG. 4C, the layer 412 has a width of D1, which may be substantially equal to a distance between two sides of the two fins to be formed, e.g., as discussed with respect to FIG. 2. Two spacers 420 and 421 may be on two sides of the layers 412, 410, as illustrated in FIGS. 4A-4C. The spacers 420, 421 may be of any appropriate material, e.g., such that the material of the spacers 420, 421 has etch selectivity with respect to the hardmask layer 412 (i.e., the material of spacers 420, 421 etches much faster than hardmask 412, for a given etch process). Thus, the spacer material 420, 421 may be selectively etched using an appropriate process, without etching the layer 412. Each of the spacers 420, 421 may have uniform width of W1. The width W1 may be at most 50, 20, 10, or 8 nm, for example. In an example, the spacers 420, 421 may be conformally deposited on both sides of the layers 412, 410. The spacer deposition may be performed using chemical vapor deposition (CVD), atomic layer deposition (ALD), and/or any appropriate spacer deposition technique. As will be appreciated, high conformality of the spacers 420, 421 can be achieved in some embodiments with ALD, which in turn assists in the accuracy of tuning the width of the fin to which the pattern being formed can be transferred.

Figure 4D:
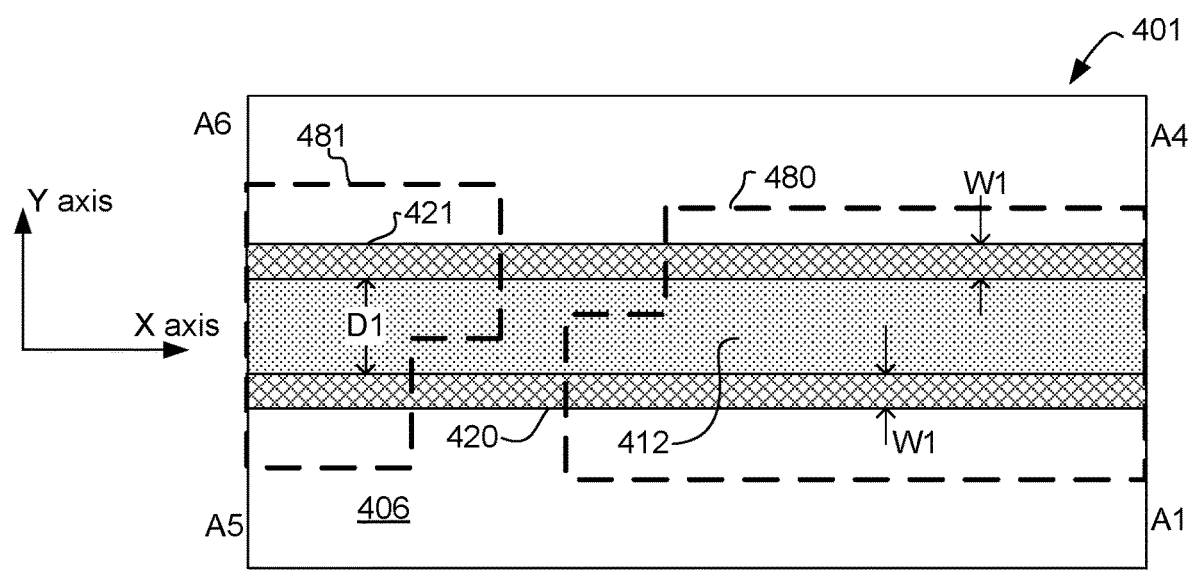

FIG. 4D illustrates a top view of the structure 401 of FIGS. 4A-4C, with layers 480, 481 comprising masking materials above the structure 401, in accordance with an embodiment of the present disclosure. The layers 480, 481 are illustrated to be transparent, with dotted boundary, merely for illustrative purposes. The layers 480, 481 mask sections of the spacers 420, 421, while exposing other sections of the spacers. The layers 480, 481 mask sections can be provisioned using standard lithography, and comprise a material that is etch selective relative to the spacers 420, 421 (i.e., the material of layers 480, 481 etches much slower than spacers 420, 421, for a given etch process).

Figure 5A:
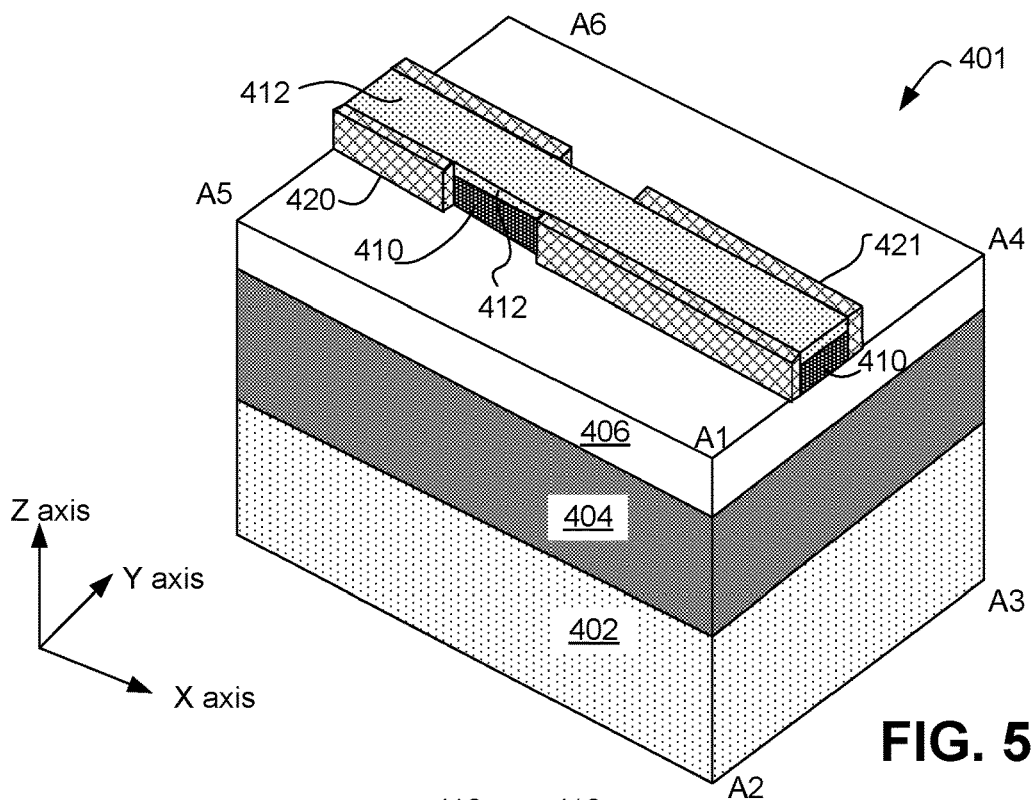
Figure 5B:
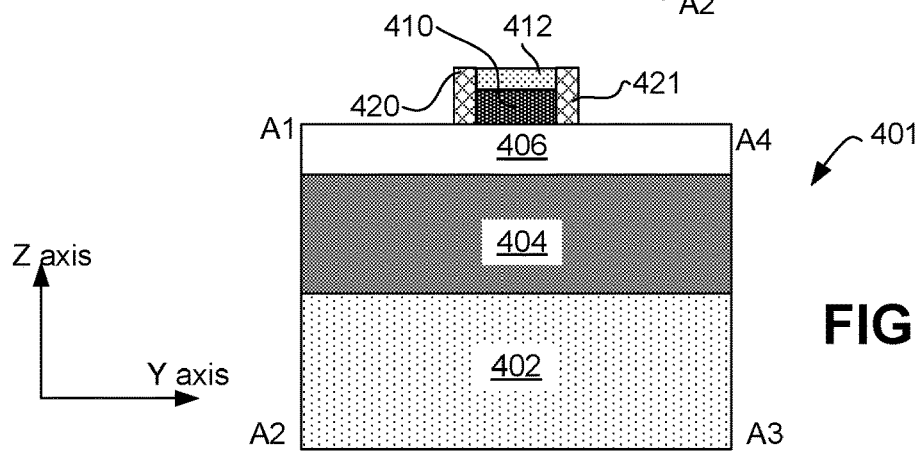
Figure 5C:
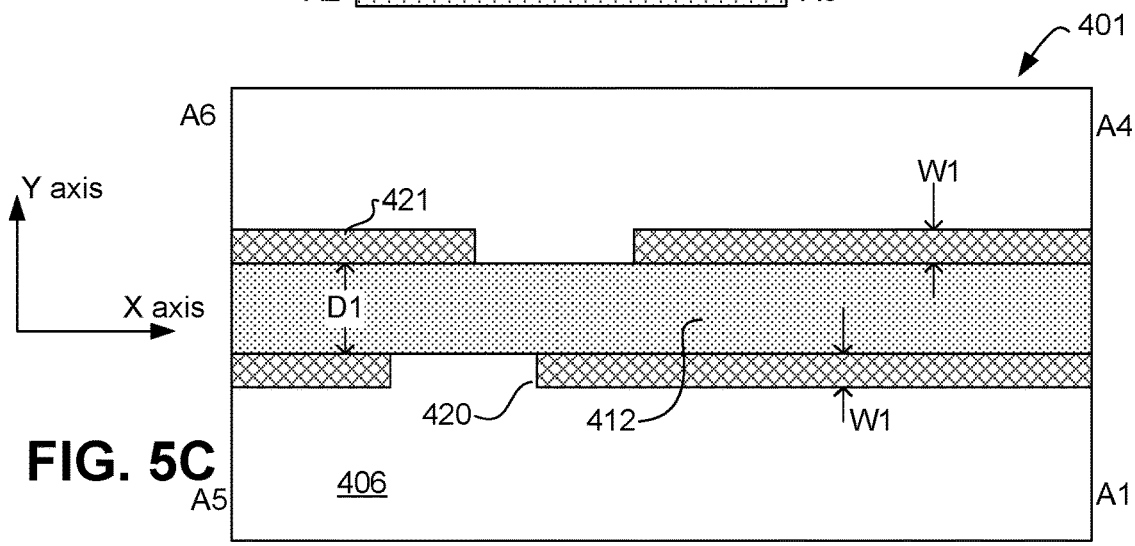

FIGS. 5A-5C illustrate the structure 401, after sections of the spacers 420, 421 exposed through the masking layers 480, 481 of FIG. 4D have been etched, and the masking layers 480, 481 removed, in accordance with an embodiment of the present disclosure. For example, FIG. 5A illustrates the side perspective view (e.g., similar to FIG. 4A), FIG. 5B illustrates the side view (e.g., similar to FIG. 4B), and FIG. 5C illustrates the top view (e.g., similar to FIG. 4C). According to an embodiment, sections of the spacers 420, 421 are etched anisotropically (e.g., dry directional etch) to expose the sidewalls of the layers 410, 412 as illustrated in FIG. 5A. The sections selected for etching are based on a final desired profile of the fins 120, 121. The etching is selective, e.g., such that the layers 410, 412, and 406 are not etched, or at least not etched significantly.

Figure 6A:
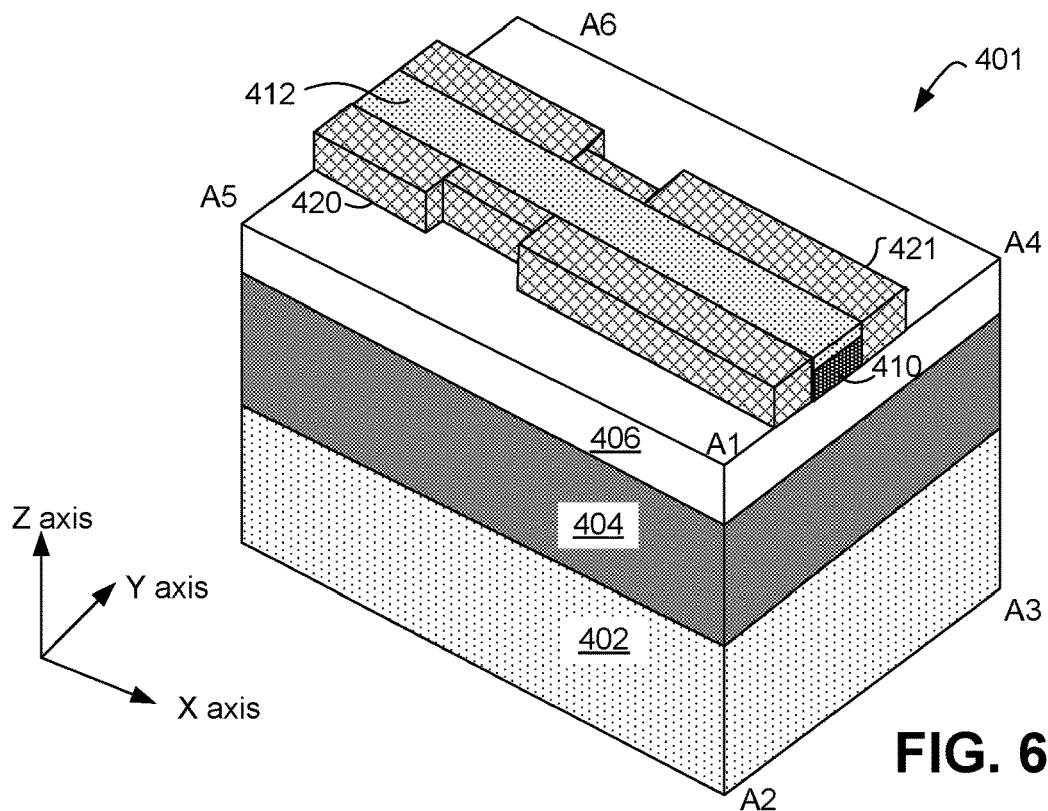
Figure 6B:
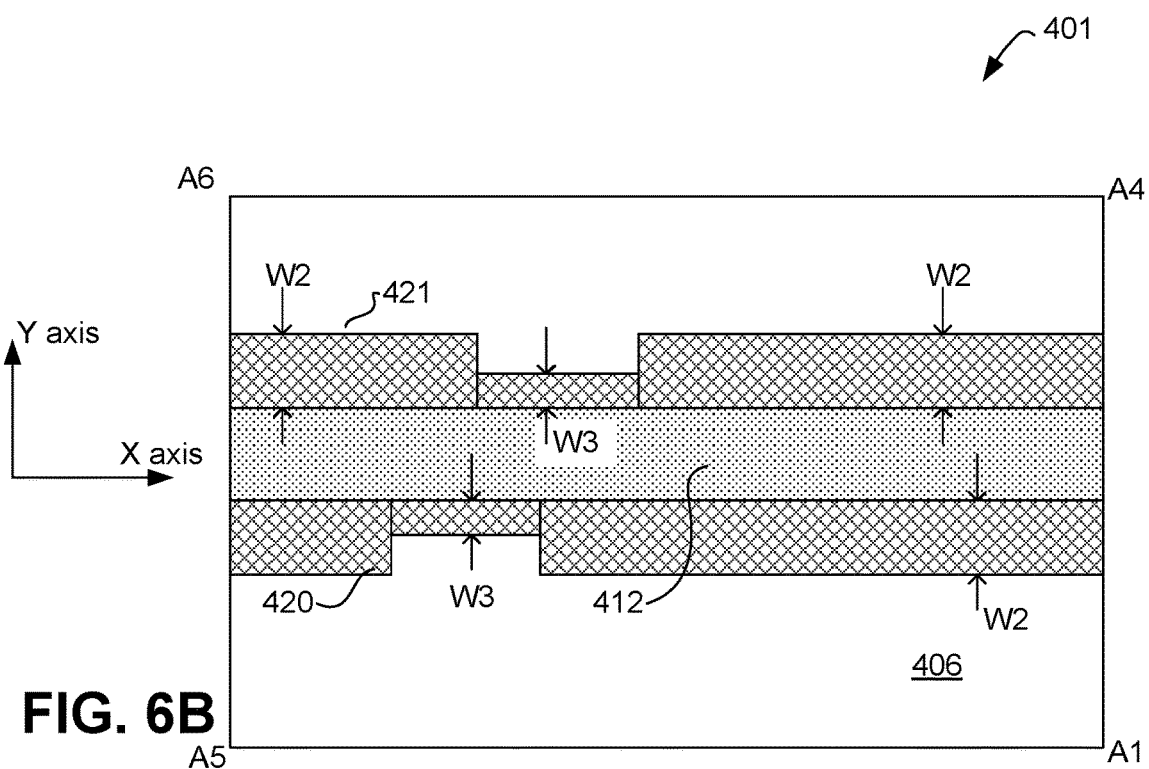

FIGS. 6A-6B illustrate the structure 401, after conformal deposition of additional spacer material on the spacers 420, 421 of FIGS. 5A-5C, in accordance with an embodiment of the present disclosure. FIG. 6A illustrates the side perspective view (e.g., similar to FIGS. 4A and 5A), and FIG. 6B illustrates the top view (e.g., similar to FIGS. 4C and 5C). The side view (e.g., similar to FIGS. 4B and 5B) is not illustrated in FIGS. 6A-6B, as there would not be any change in the side view. The additional spacer material deposition may be performed, for example, using CVD, ALD, and/or any appropriate spacer deposition technique, depending on factors such as desired degree of conformality. Due to the conformal deposition of the spacer material, according to an embodiment, sections where spacers were previously removed (e.g., as discussed with respect to FIGS. 5A-5B) now have a relatively smaller width W3, e.g., compared to a width W2 of the sections where the spacers were masked off and not previously removed.

Figure 6C:
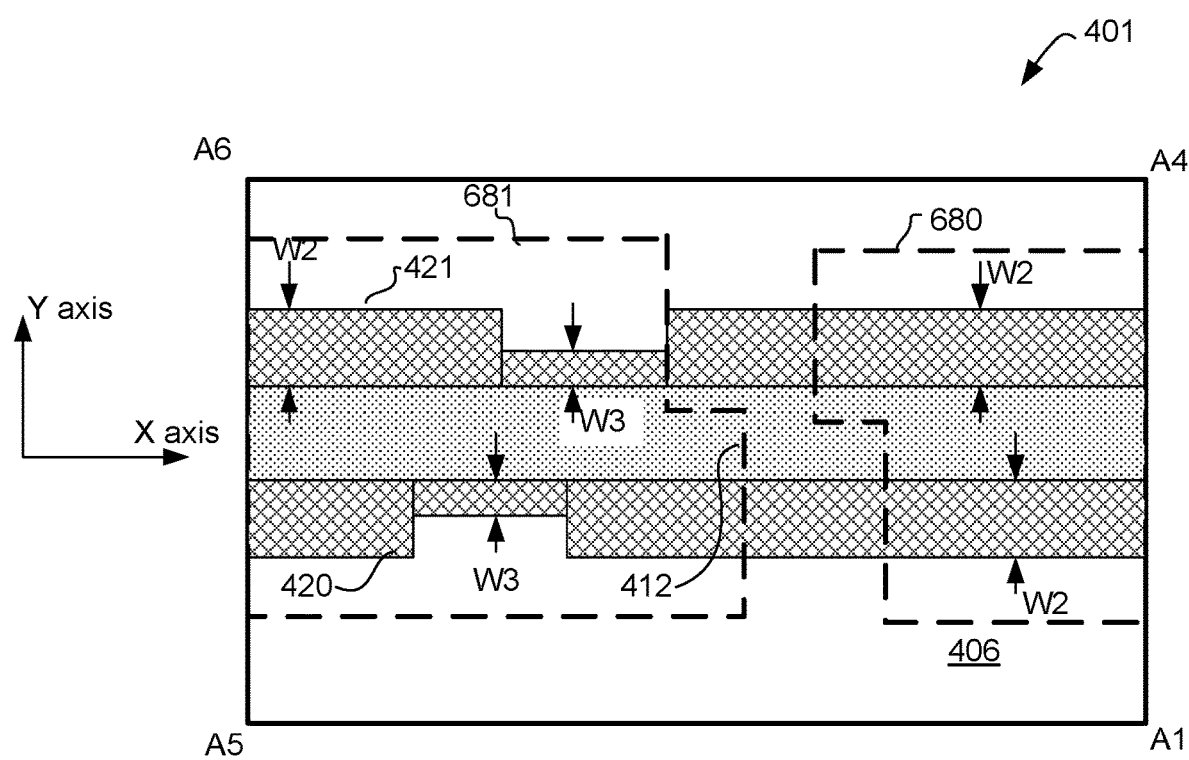

FIG. 6C illustrates a top view of the structure 401, with layers 680, 681 comprising masking materials above the structure 401 of FIGS. 6A-6B, in accordance with an embodiment of the present disclosure. The layers 680, 681 are illustrated to be transparent, with dotted boundary, merely for purposes of illustrative purposes. The layers 680, 681 mask sections of the spacers 420, 421, while exposing other sections of the spacers. The layers 680, 681 mask sections can be provisioned using standard lithography, and comprise a material that is etch selective relative to the spacers 420, 421 (i.e., the material of layers 680, 681 etches much slower than spacers 420, 421, for a given etch process). Note that layers 680, 681 can be the same mask material as 480, 481.

Figure 7:
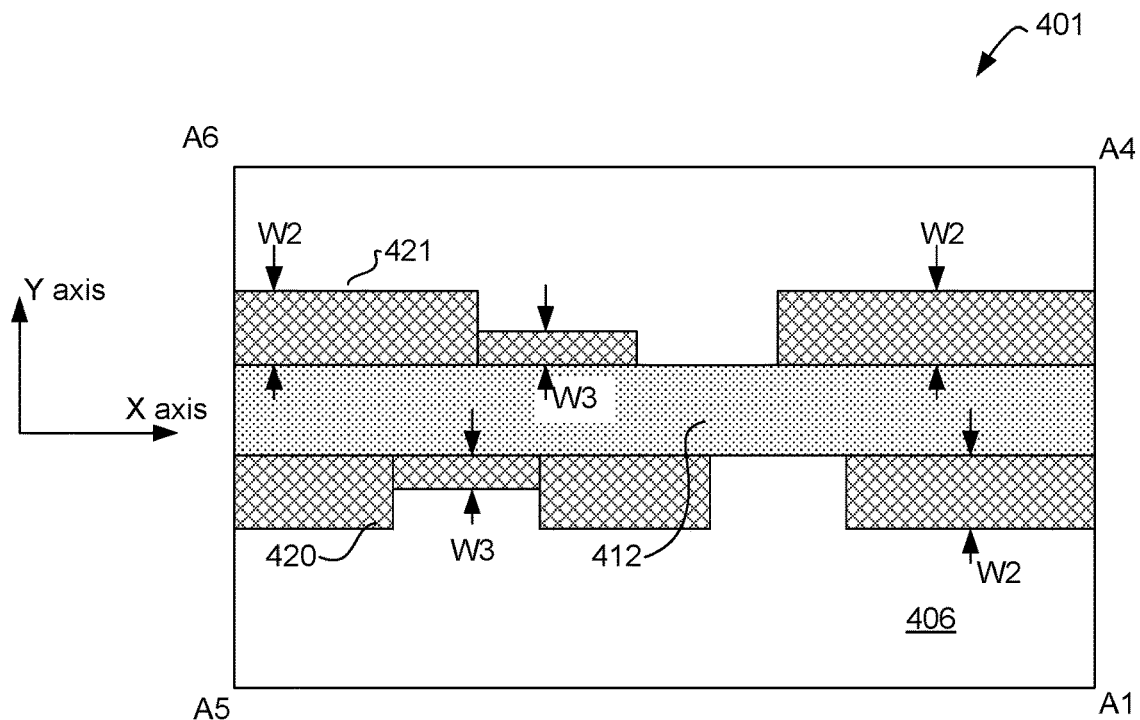

FIG. 7 illustrates the structure 401, after sections of the spacers 420, 421 exposed through the masking layers 680, 681 of FIG. 6C have been etched, and the masking layers 680, 681 removed, in accordance with an embodiment of the present disclosure. For example, FIG. 7 illustrates the top view (e.g., similar to FIGS. 4C, 5C, and 6C). As can be seen, sections of the spacers 420, 421 are etched anisotropically to expose the sidewalls of the layers 410, 412 as illustrated in FIG. 7. The sections selected for etching are based on a final desired profile of the fins 120, 121.

Figure 8:
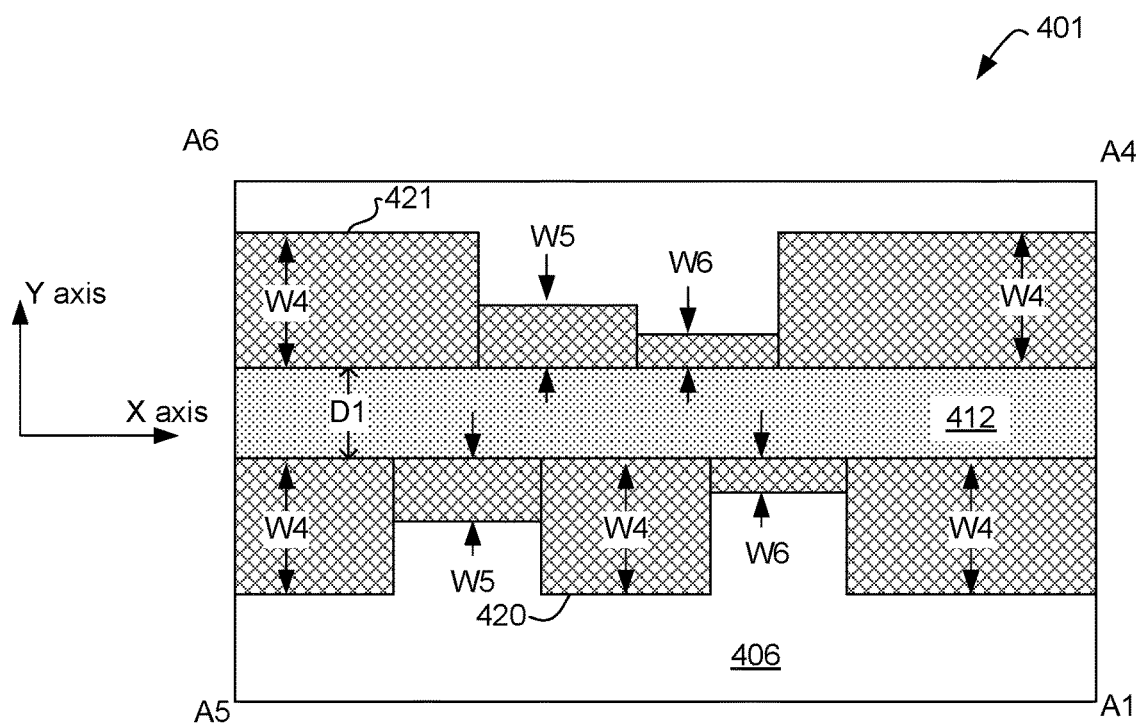

FIG. 8 illustrates the structure 401, after conformal deposition of additional spacer material on the spacers 420, 421 of FIG. 7, in accordance with an embodiment of the present disclosure. FIG. 8 illustrates the top view of the structure 401. The spacer material deposition may be performed using CVD, ALD, and/or any appropriate spacer deposition technique, as previously explained. Due to the conformal deposition of the spacer material according to some embodiments, sections where spacers were previously removed (e.g., as discussed with respect to FIGS. 5A-5B and 7) would have a relatively smaller width. For example, the narrowest section of the spacers 420, 421, e.g., sections which were removed in FIG. 7, have width W6. Also, the width W2 of sections of the spacers (e.g., as illustrated in FIG. 7) increases to a width W4 in FIG. 8, e.g., due to the deposition of the spacer material in FIG. 8. Similarly, the width W3 of sections of the spacers (e.g., as illustrated in FIG. 7) increases to a width W5. Note with a highly conformal deposition process (e.g., ALD) that each of the width W4-6 can be readily controlled in a linear fashion, in that the thicknesses will all grow at the same rate (e.g., one monolayer of spacer material at a time, or some other rate).

Figure 9A:
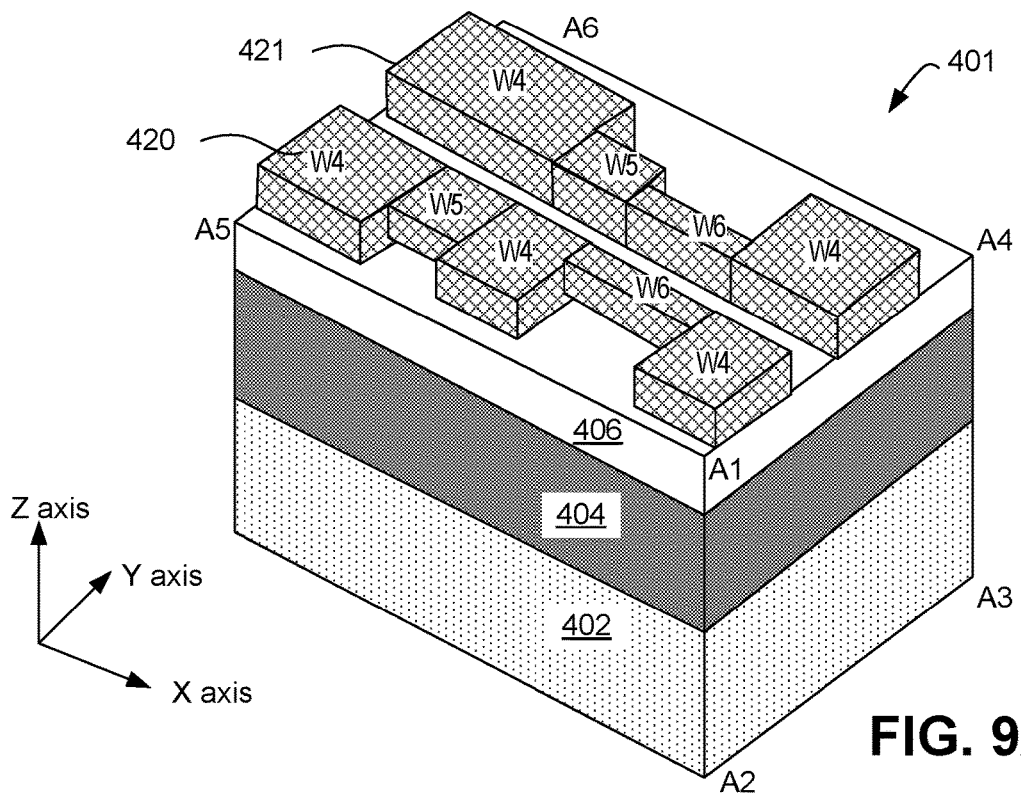
Figure 9B:
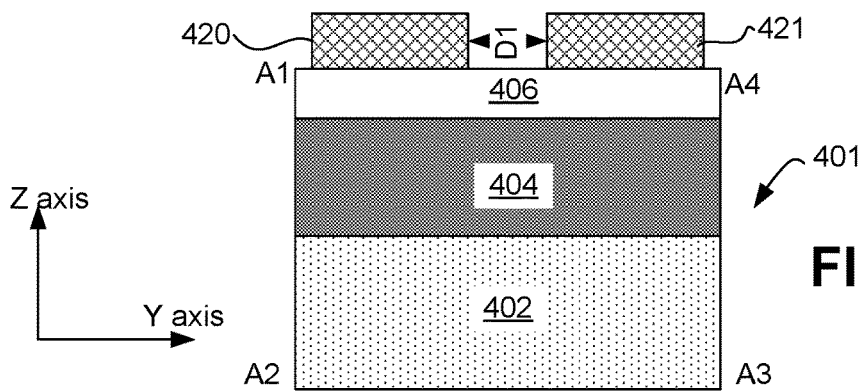
Figure 9C:
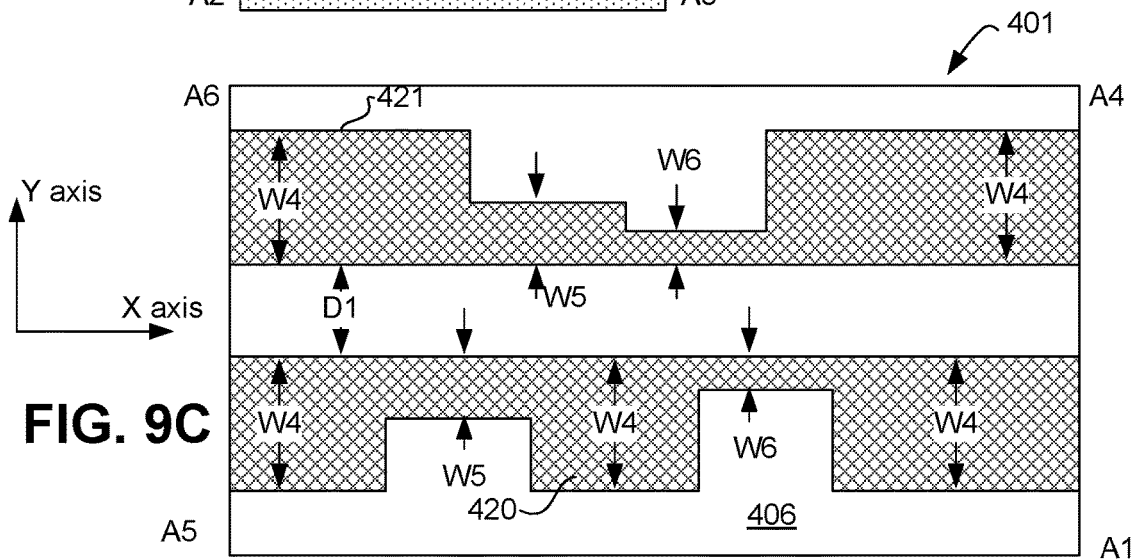

FIGS. 9A, 9B, 9C illustrate the structure 401, after removal of the layers 410, 412 of FIG. 8, in accordance with an embodiment of the present disclosure. For example, FIG. 9A illustrates the side perspective view, FIG. 9B illustrates the side view, and FIG. 9C illustrates the top view. The layers 410, 412 are selectively etched, without etching the spacers 420, 421. The width of various sections of the spacers 420, 421 (e.g., widths W4, W5, W6) are labelled in FIGS. 9A and 9C.

Figure 10A:
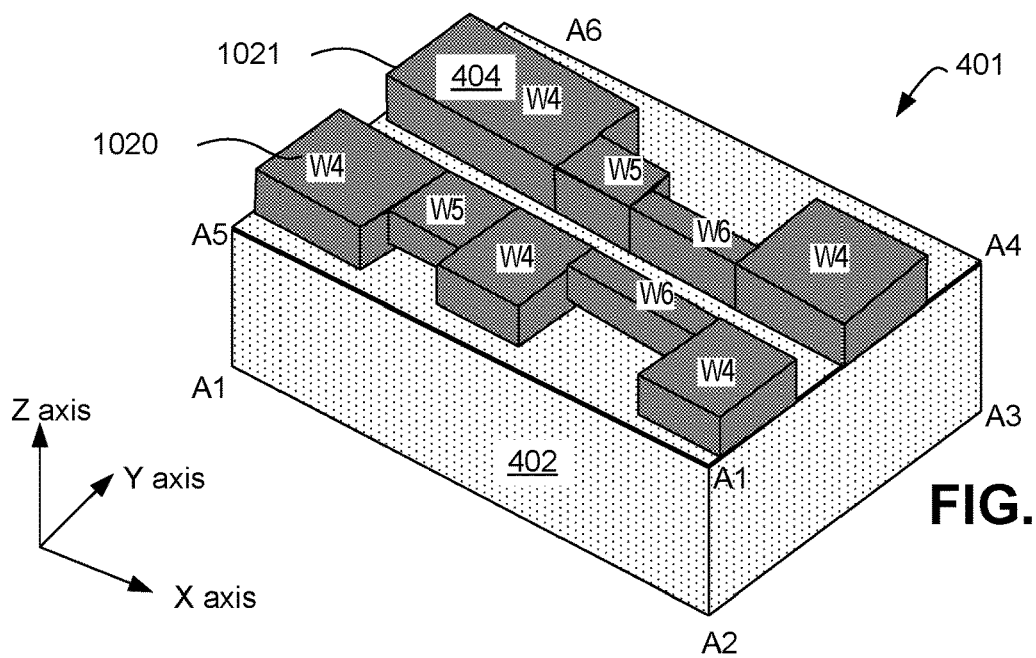
Figure 10B:
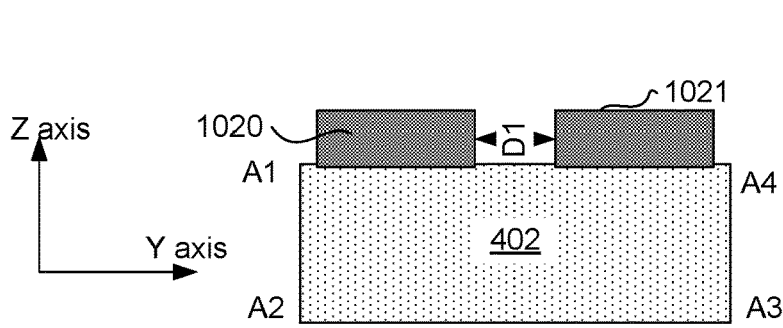
Figure 10C:
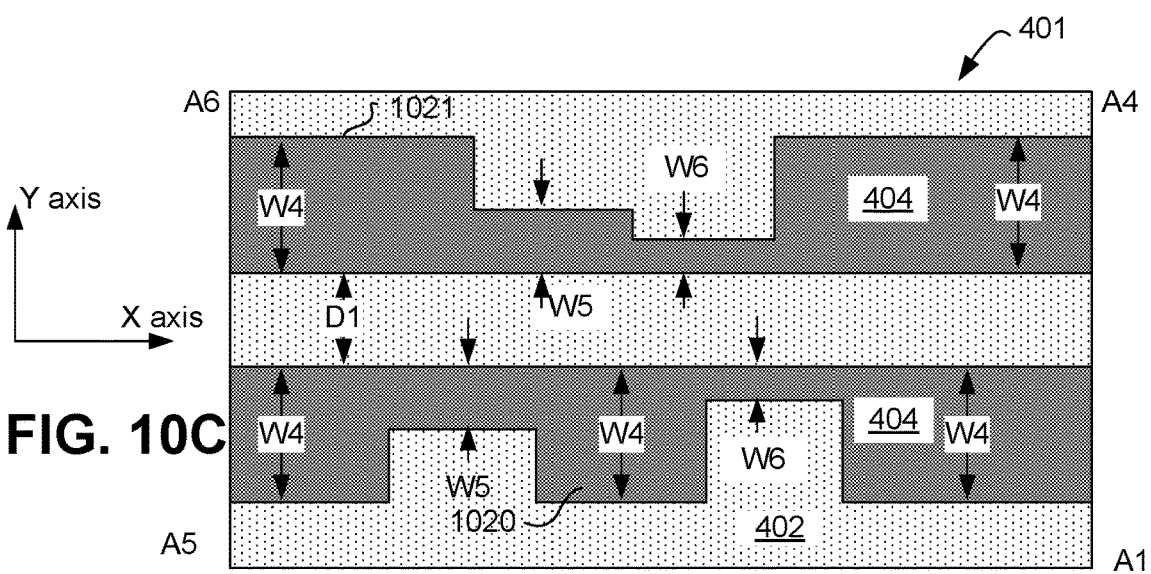

FIGS. 10A, 10B, 10C illustrate the structure 401, after removal of the layer 406 of FIGS. 9A-9C, in accordance with an embodiment of the present disclosure. The etch of layer 406 is selective to the spacer material (i.e., layer 406 etches much faster than the spacer material for a given etch process). The spacers 420, 421 act as a hardmask while the layers 404, 406 are patterned. Thus, sections of the layers 404, 406 underneath the spacers 420, 421 are not removed, while other sections of the layers 404, 406 not covered by the spacers 420, 421 are etched. Subsequently, the spacers 420, 421 are selectively etched, without etching the patterned layers 404, 406. Subsequently, the patterned layer 406 is also removed, thereby reveling the now patterned hardmask layer 404. In this manner, the multi-width patterns of the spacers 420, 421 shown in FIG. 9C are transferred to the underlying hardmask layer 404. As will be appreciated, this patterned version of hardmask layer 404 effectively provides a new set of spacers directly on the layer 402 in which the multi-width fins are to be formed. These new spacers are designated as 1020, 1021 in FIGS. 10A-C. Hence, the spacers 1020, 1021 have substantially the same shape and dimensions as the spacers 420, 421, respectively. That is, the multi-width profiles of spacers 420, 421 shown in FIG. 9C are transferred to spacers 1020, 1021 formed in the layer 404.

Figure 11A:
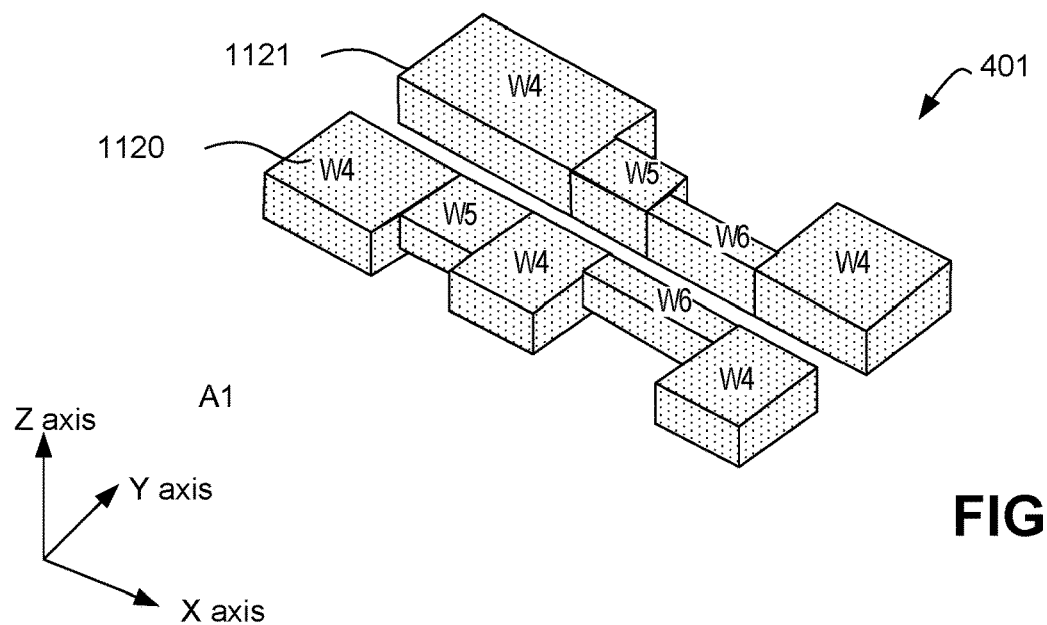
Figure 11B:
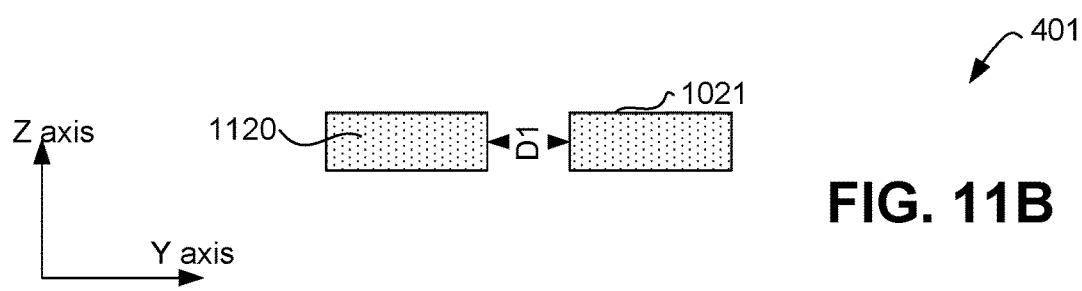
Figure 11C:
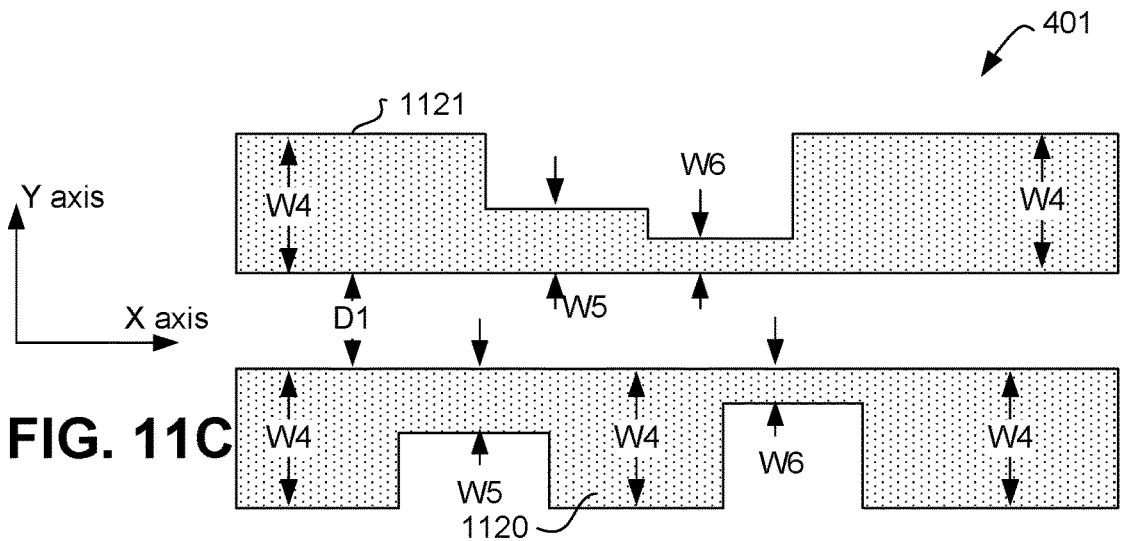

FIGS. 11A, 11B, 11C illustrate the structure 401, after patterning of the layer 402, in accordance with an embodiment of the present disclosure. The spacers 1020, 1021 acts as a hardmask while the layer 402 is patterned. Thus, sections of the layer 402 underneath the spacers 1020, 1021 are not removed, while other sections of the layer 402 not covered by the spacers 1020, 1021 are etched. The depth of the etch can vary from one embodiment to the next, and can be set based on the desired channel height. In some cases, the layer 402 is etched to a depth in the range of 10 to 50 nm (e.g., 15 to 35 nm, or about 20 nm). Subsequently, the spacers 1020, 1021 are removed (e.g., via a selective etch) to reveal the underlying multi-width fins 1120, 1121 formed in layer 402. Thus, the fins 1120, 1121 have substantially the same shape and dimensions as the spacers 1020, 1021, respectively. That is, the multi-width spacers 1020, 1021 are transferred to the layer 402, thereby providing substantially similar multi-width fins 1120, 1121 (e.g., where each dimension of the multi-width spacers 1020, 1021 is transferred to the multi-width fins 1120, 1121 within a tolerance of 2 nm or less, or 1 nm or less, or 0.5 nm or less).

Figure 11D:
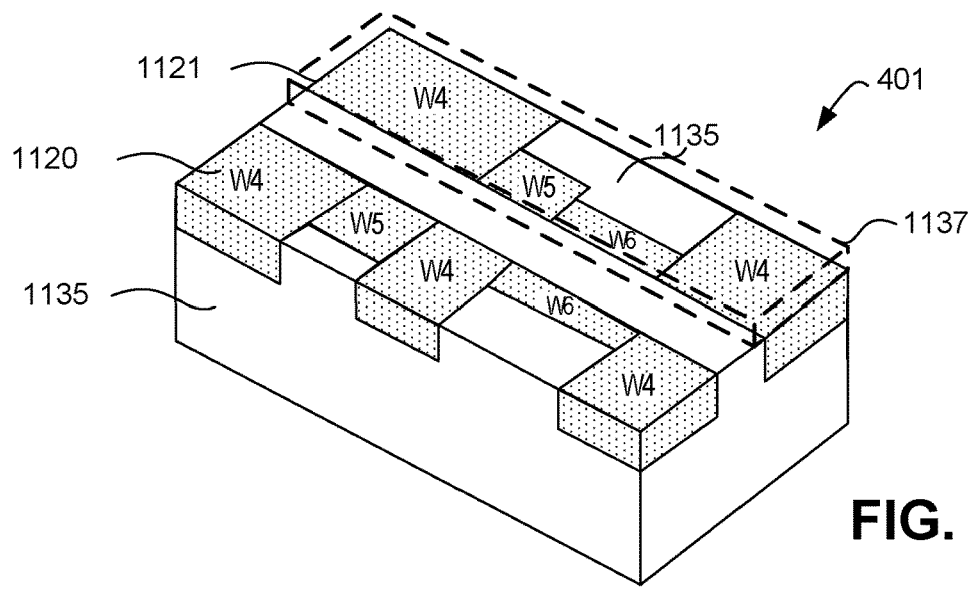
Figure 11E:
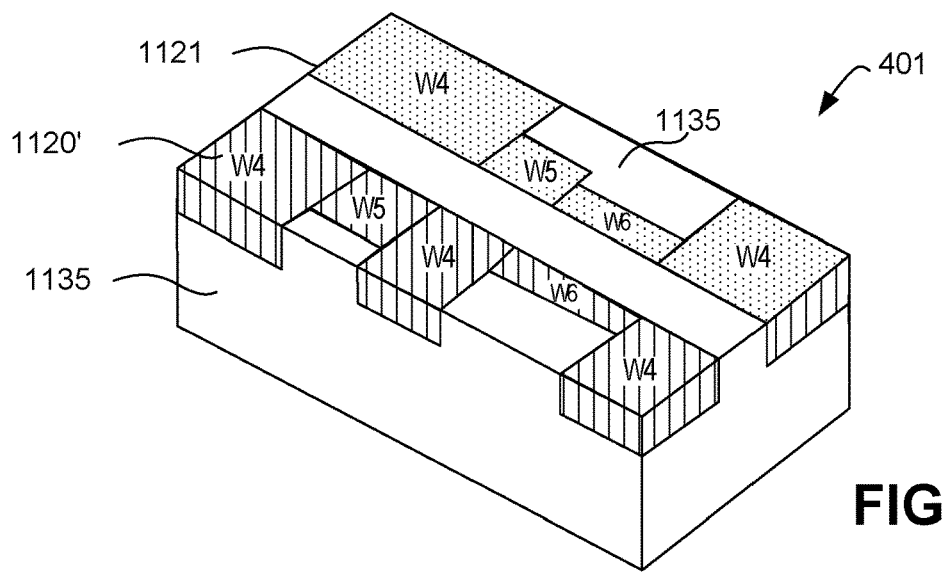
Figure 11F:
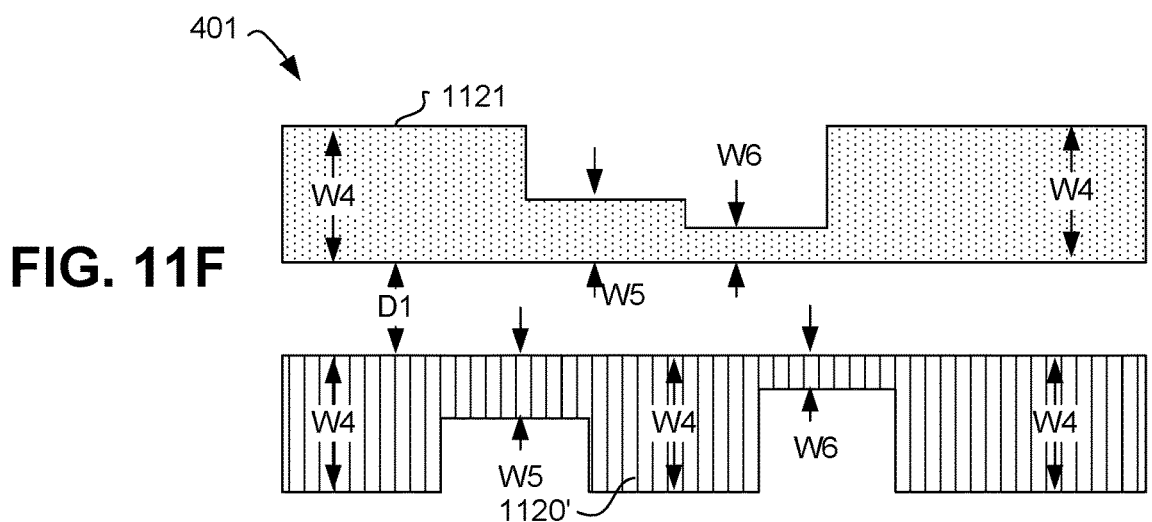

FIGS. 11D, 11E, 11F collectively illustrate a selective etch and replace process for replacing at least a portion of one or more of fins 1120, 1121 with fins having a different semiconductor material, in accordance with an embodiment of the present disclosure.

In this example embodiment, and as can be seen in FIG. 11D, fins 1120, 1121 are encased in an insulator material 1135, which can be deposited using standard deposition (e.g., CVD, ALD) and then planarized to the top of fins 1120, 1121. The insulator material 1135 is chosen to facilitate the selective etching of one or more of the fins 1120, 1121 (i.e., fins 1120, 1121 will etch at a much fast rate than insulator material 1135, for a given etch). In this example case, fin 1121 is masked off with mask 1137, so it will not be replaced. Note the mask 1137 and insulator material 1135 can be the same material, in some such embodiments. An etch (e.g., anisotropic dry etch) is then carried out to remove at least part of the exposed fin 1120. In other embodiments, there is no mask such that both fins 1120, 1121 are replaced. In still other embodiments, fin 1120 is replaced with a first material while fin 1121 is masked off, and then fin 1121 is replaced with a second material while newly formed fin 1120' is masked off. Numerous variations will be appreciated.

As can be seen in FIG. 11E, after fin 1120 is at least partially removed, a replacement semiconductor material is epitaxially deposited in the trench left by that removal. The deposition can be, for example, ALD or CVD. Any excess replacement material that is deposited on the structure can then planarized away along with the mask 1137, so as to leave the structure of FIG. 11E.

FIG. 11F shows the resulting structure 401 after the insulator material 1135 has been removed or recessed to expose fins 1120', 1121. In an example embodiment, multi-width fin 1120' comprises a group III-V semiconductor material (e.g, GaAs or InGaAs), and multi-width fin 1121 comprises a group IV semiconductor material (e.g., silicon, germanium, or SiGe). In still other example embodiments, recall that at least one of fins 1120, 1121 (and/or 1120', and/or 1121') can be a multilayer structure that includes two or more alternating layers of active channel material and sacrificial material. Such multilayer structures can be used for forming nanowires, nanoribbons, or nanosheets. For instance, in some such example cases, the sacrificial material can be exposed and selectively removed during a subsequent gate forming process so as to liberate or release one or more wires (or ribbons or sheets, as the case may be) comprising the active channel material.

Thus, FIGS. 4A-11F illustrate formation of fins for a transistor, where individual ones of the fins have varying width. As discussed with respect to FIG. 2, individual ones of the fins 1120, 1121 (and/or their replacements fins, as variously explained herein) of FIGS. 11A-11F are asymmetrical and has varying widths, e.g., as discussed in further details with respect to FIG. 2. Note that, according to some embodiments provided herein, the asymmetry is attributable to variations occurring on one side of the fin while the other side of that fin remains relatively constant (linear). Further note that, in some such embodiments, the constant sides of the fins in a given fin-pair face each other. These are tell-tale signs of a methodology provided herein, according to some such embodiments.

It is to be noted that the transition of widths in the fins 1120, 1121 (and/or their replacement fins, if present) are relatively sharp in FIGS. 11A, 11C-F, which may be an ideal scenario. However, in practice, a section of a fin with a first width may transition to a section of the fin having a second width over a length (e.g., length L1) of the fin, e.g., as discussed with respect to FIG. 2 in further details. So, for example, transitions may occur relatively abruptly such that the sidewall at the point where the transition begins is substantially orthogonal to the side of the fin, such as about 90 degrees, +/−5 degrees, according to some embodiments, but in other embodiments, the transition may occur over a longer distance so as to provide a transition angle of 80 to 95 degrees.

When variations in a width of a feature occur over the length of the feature (e.g., e.g., due to limitations in techniques for formation of the feature), the variation is called line width roughness (LWR). For example, referring to FIG. 11C, a section of the fin 1121 has a width of W5. The actual width along the length of the section may vary slightly, e.g., due to limitations in techniques for formation of the fin 1121. Such variation is referred to as LWR. For example, for the section of the fin 1121 illustrated to have a width of W5, the width is within ±LWR of W5 along the length of the section. In the spacer-based techniques discussed herein to form the fins, the LWR is in the range of Angstroms, e.g., may be at most 2 Angstrom, 5 Angstrom, 7 Angstrom, 8 Angstrom, or 10 Angstrom. In contrast, fins formed using conventional techniques have an LWR that is about 30 times or even higher than the LWR achieved in various examples and embodiments of this disclosure.

FIGS. 12A, 12B, 12C, 13, 14, 15, 16, 17A, 17B, and 17C collectively illustrate a method for making fins for a transistor, where individual ones of the fins have varying width and are symmetrical, in accordance with an embodiment of the present disclosure. For example, the method is used to make the symmetrical fins of FIG. 3. To the extent that previous discussion with respect to the asymmetrical embodiments is also relevant to symmetrical embodiments, that previous discussion is equally applicable here, including discussion with respect to place holder fins for use in an etch-and-replace process, as well as cases where layer 402 is a multilayer structure suitable for forming nanowires, etc.

Figure 12A:
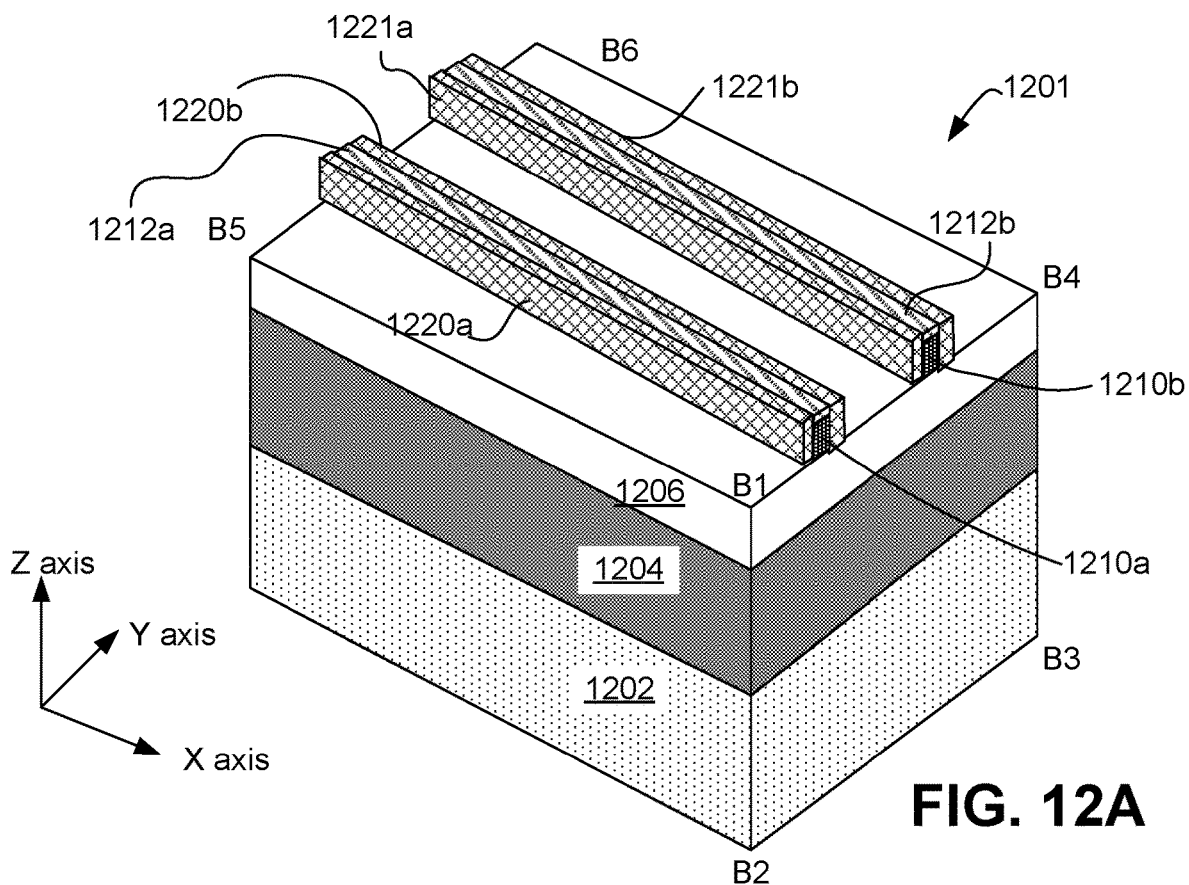
FIGS. 12A, 12B, 12C, 13, 14, 15, 16, 17A, 17B, and 17C collectively illustrate example methods for making fins for non-planar transistors, where individual ones of the fins have varying width and are symmetrical, in accordance with other embodiments of the present disclosure.
Figure 12B:
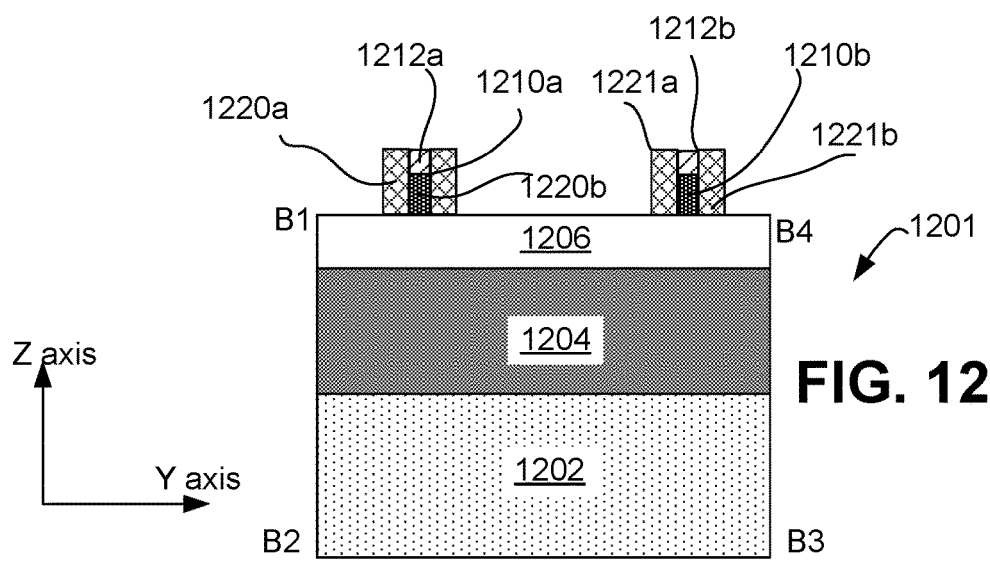
Figure 12C:
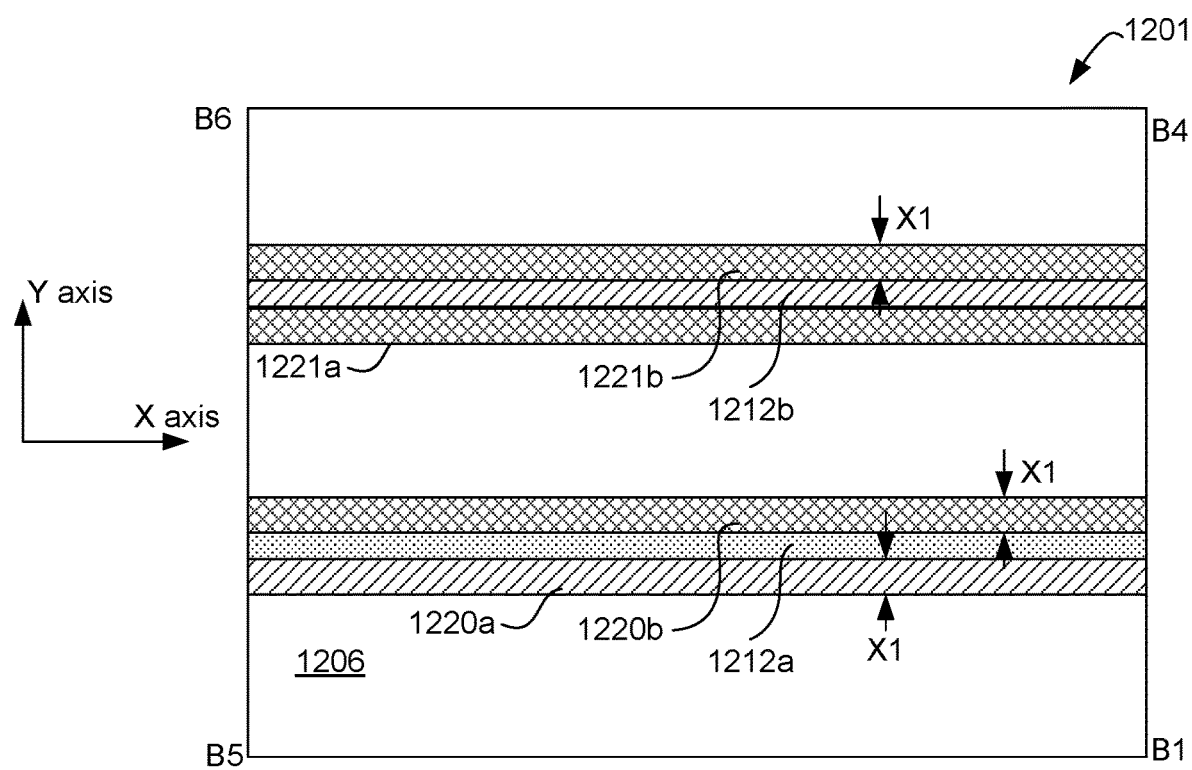

FIGS. 12A, 12B, 12C illustrate a structure 1201 for forming fins with varying widths, in accordance with an embodiment of the present disclosure. FIG. 12A is a perspective view of the structure 1201. Six corners B1, B2, B3, B4, B5, and B6 of the structure 1201 are illustrated in FIG. 12A. FIG. 12B is a side view of the structure 1201, shown along the plane of B1, B2, B3, and B4. FIG. 12C is a top view of the structure 1201, shown along the plane of B1, B4, B6, and B5.

Referring to FIGS. 12A-12C, the structure 1201 comprises a layer 1202, e.g., similar to the layer 402 of FIGS. 4A-4C. As will be discussed herein later, the layer 1202 may be used to form the fins, and accordingly, the material of the layer 1202 may be the material used for the fins. Although not illustrated in FIGS. 12A-12C, in some embodiments, the layer 1202 may be over a substrate, such as the substrate 100 of FIG. 1A.

One or more hardmask layers, such as layers 1204 and 1206 (e.g., similar to the layers 404, 406, respectively, of FIGS. 4A-4C), may be above the layer 1202, e.g., as discussed in further details with respect to FIGS. 4A-4C. Layers 1210a and 1212a may be formed above the layer 1206, and layers 1210b and 1212b may be formed above the layer 1206. For example, layer 1210a is above the layer 1206, and layer 1212a masks the layer 1210a. Similarly, layer 1210b is above the layer 1206, and layer 1212b masks the layer 1210b. The layers 1210a, 1212a may be respectively similar to layers 410, 412 of FIGS. 4A-4C, and the layers 1210b, 1212b may also be respectively similar to layers 410, 412 of FIGS. 4A-4C. In an example, a width of each of the layers 1212a, 1212b may be smaller than the width D1 of the layer 412 of FIGS. 4A-4C. Merely as an example, the width of each of the layers 1212a, 1212b may be at most 20 nm, 10 nm, 8 nm, 5 nm, 4 nm, or 3 nm.

Two spacers 1220a and 1220b may be formed conformally on two sides of the layers 1212a, 1210a. Similarly, two spacers 1221a and 1221b may be formed conformally on two sides of the layers 1212b, 1210b. The spacers 1220a, 1220b, 1221a, 1221b may be similar to the spacers 420, 421 of FIGS. 4A-4C.

Figure 13:
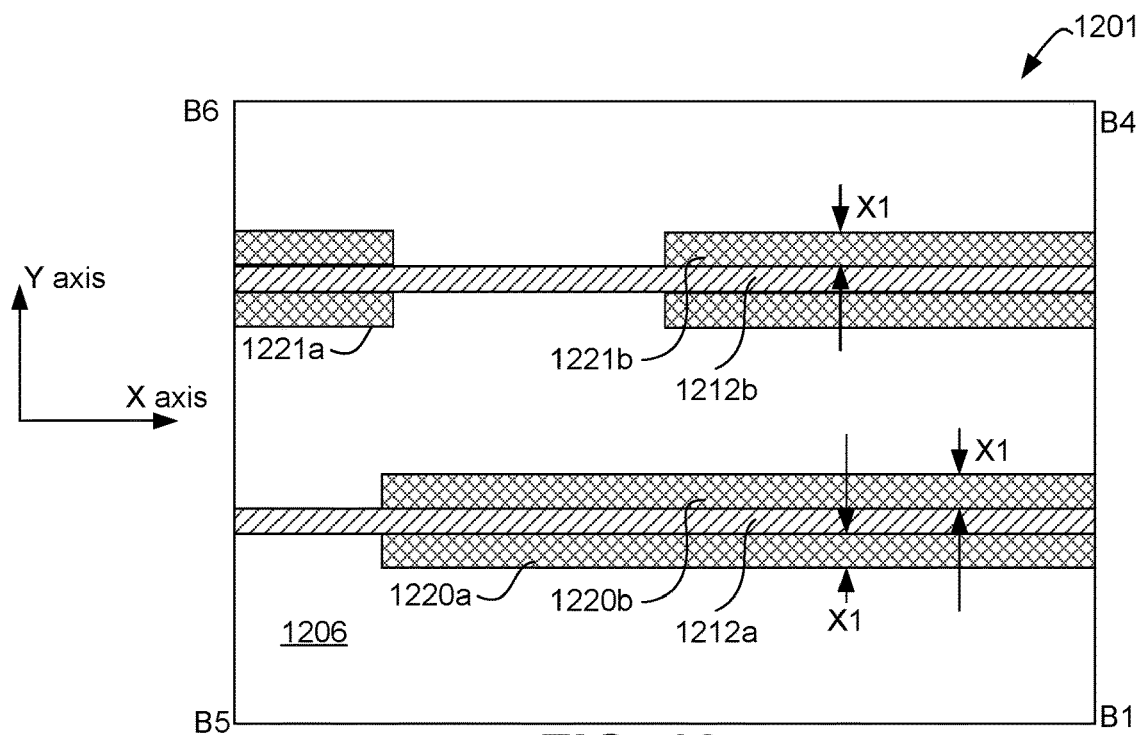

FIG. 13 illustrates a top view of the structure 1201, after sections of the spacers 1220a, 1220b, 1221a, 1221b of FIGS. 12A-12C are removed, in accordance with an embodiment of the present disclosure. For example, sections of the spacers 1221a, 1221b, 1220a, 1220b are covered by masking layers, and exposed sections of the spacers 1221a, 1221b, 1220a, 1220b (e.g., not covered by the masking layers) are etched, and then the masking layers are removed, e.g., as previously discussed in further details with respect to FIGS. 4D, 5A-5C. Anisotropically etching sections of the spacers 1221a, 1221b, 1220a, 1220b exposes the sidewalls of the layers 1221a, 1221b, 1210a, 1210b. The sections selected for etching are based on a final desired profile of the fins. The etching is selective, e.g., such that the layers 1212a, 1212b, 1206 are not etched, or at least not etched significantly. In an example, the remaining sections of the layers 1220a, 1220b, 1221a, 1221b has a width of X1.

Figure 14:
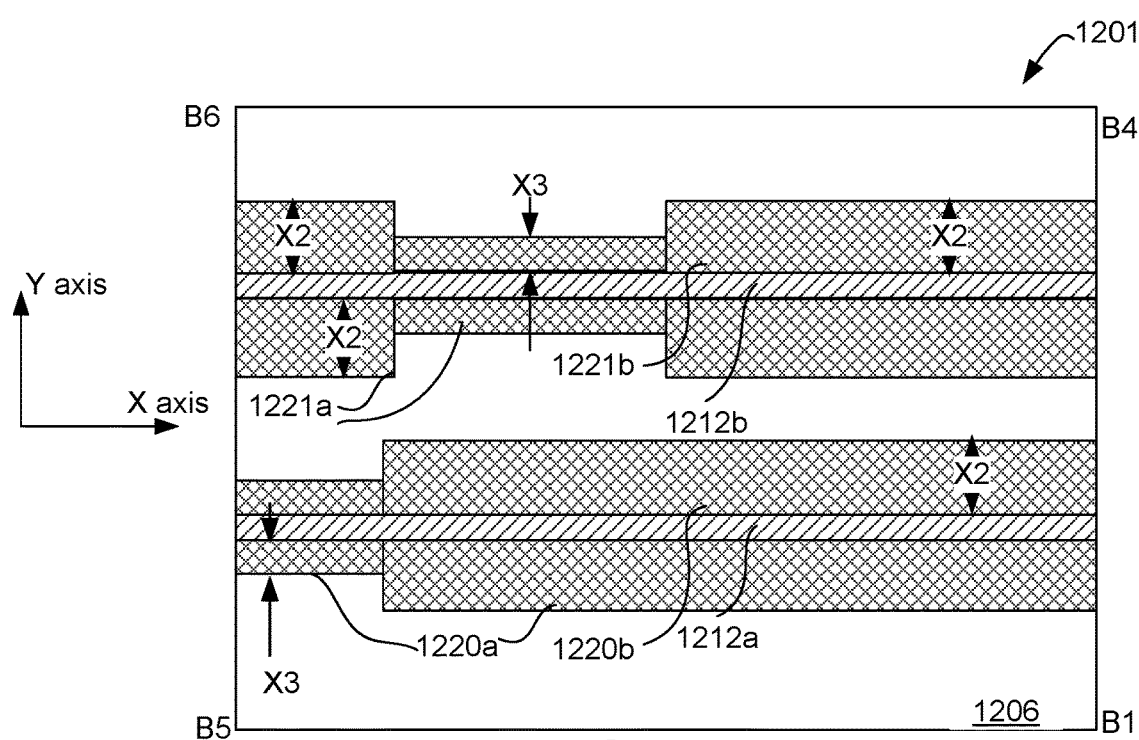

FIG. 14 illustrates a top view of the structure 1201, after conformal deposition of additional spacer material on the spacers 1220a, 1220b, 1221a, 1221b of FIG. 13, in accordance with an embodiment of the present disclosure. The spacer material deposition may be performed, for example, using CVD, ALD, and/or any appropriate spacer deposition technique. Due to the conformal deposition of the spacer material, according to some embodiments, sections where spacers were previously removed (e.g., as discussed with respect to FIG. 13) would have a relatively smaller width X3, e.g., compared to a width X2 of the sections where the spacers were not removed.

Figure 15:
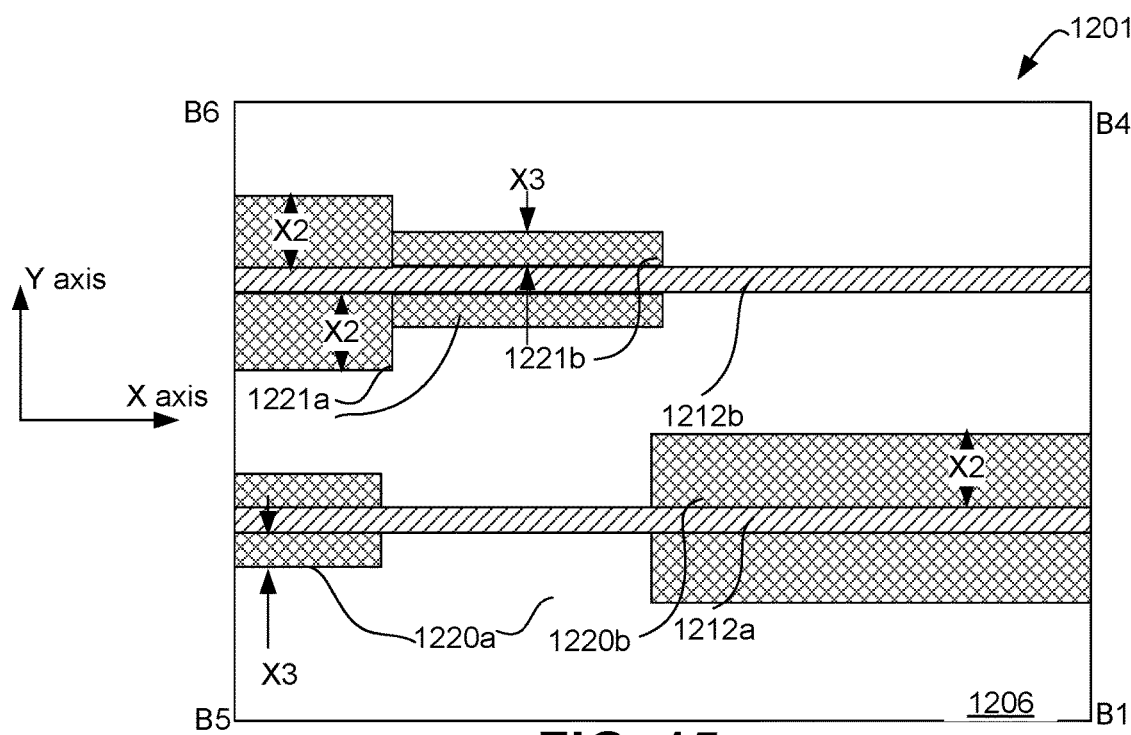

FIG. 15 illustrates the structure 1201, after sections of the spacers 1220a, 1220b, 1221a, 1221b are removed from the structure 1201 of FIG. 14, in accordance with an embodiment of the present disclosure. For example, FIG. 15 illustrates the top view of the structure 1201. For example, although not illustrated, sections of the spacers 1221a, 1221b, 1220a, 1220b are covered by masking layers, and exposed sections of the spacers 1221a, 1221b, 1220a, 1220b (e.g., not covered by the masking layers) are etched, and then the masking layers are removed, e.g., as previously discussed in further details with respect to FIGS. 4D, 5A-5C. The sections selected for etching are based on a final desired profile of the fins. The etching is selective, e.g., such that the layers 1212a, 1212b, 1206 are not etched, or at least not etched significantly. In an example, the remaining sections of the layers 1220a, 1220b, 1221a, 1221b has width of X3 and X2, e.g., similar to FIG. 14.

Figure 16:
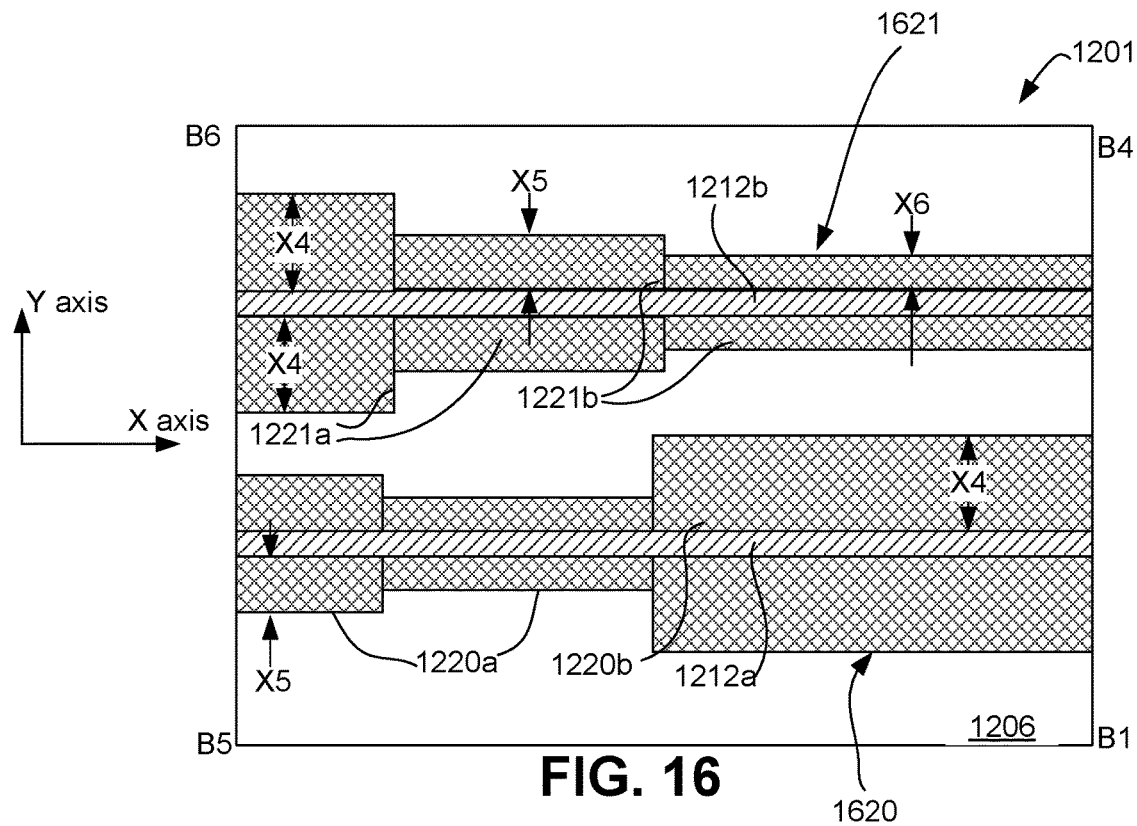

FIG. 16 illustrates a top view of the structure 1201, after conformal deposition of additional spacer material on the spacers 1220a, 1220b, 1221a, 1221b of the structure 1201 of FIG. 15, in accordance with an embodiment of the present disclosure. The spacer material deposition may be performed using CVD, ALD, and/or any appropriate spacer deposition technique. Due to the conformal deposition of the spacer material, sections where spacers were previously removed (e.g., as discussed with respect to FIG. 16) would have a relatively smaller width X6. Sections of the spacers that previously had width of X3 now has a width of X5; and sections of the spacers that previously had width of X2 now has a width of X4. As seen, X4 is greater X5, which is greater than X6.

In FIG. 16, a structure comprising the layers 1212b and spacers 1221a, 1221b are, in combination, referred to as structure 1621; and a structure comprising the layers 1212a and spacers 1220a, 1220b are, in combination, referred to as structure 1620. The structures 1620, 1621, in future processing, acts as a hardmask for the fins to be formed. That is, the corresponding fins to be formed each has a shape and dimensions substantially similar to those of the respective structures 1620, 1621.

Figure 17A:
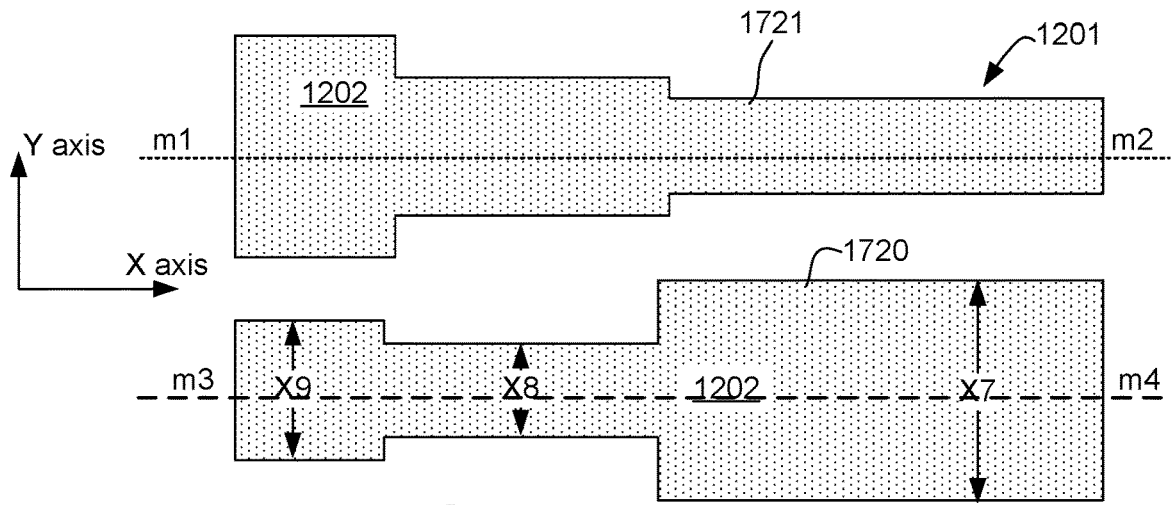
Figure 17B:
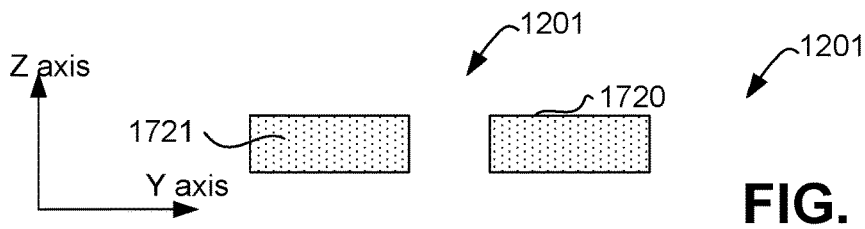
Figure 17C:
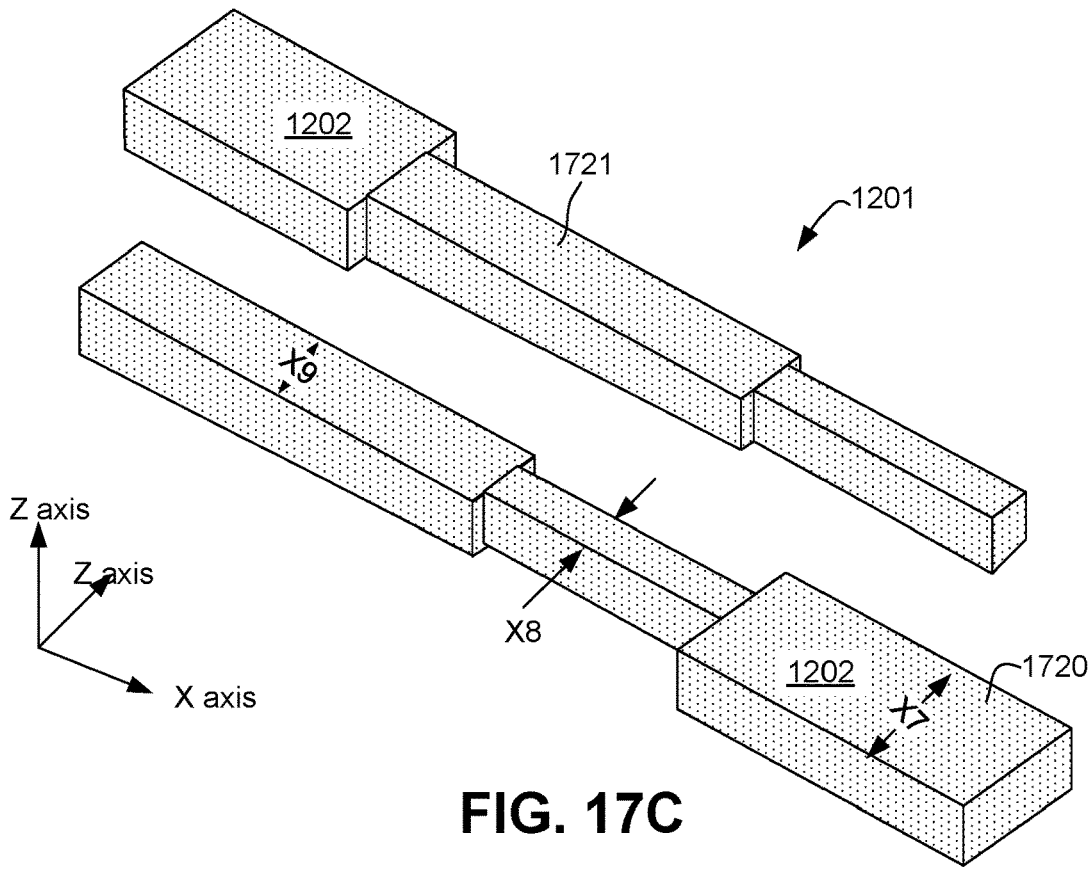

FIGS. 17A-17C illustrate the structure 1201, after removal of the layers 1206, 1204, and transferring the structures 1620, 1621 as fins 1720, 1721, respectively, in the layer 1202, in accordance with an embodiment of the present disclosure. For example, similar to the techniques discussed with respect to FIGS. 10A-10C, 11A-11C, the layers 1206, 1204 are patterned, while the structure 1620, 1621 act as hardmasks, thereby transferring the pattern of the structure 1620, 1621 to the layer 1204, and then the structures 1620, 1621 are removed. Subsequently, the structures formed in the layer 1204 acts as a hardmask while the underlying layer 1202 is patterned, thereby transferring the pattern of the structure 1620, 1621 to the layer 1202, and then the patterned layer 1204 is removed. This results in the multi-width fins 1720 and 1721 comprising the patterned layer 1202, as illustrated in the top view of FIG. 17A, side view of FIG. 17B, and side perspective view of FIG. 17C.

Each of the fins 1720 and 1721 are symmetrical about a central axis that passes along the length and in the middle of the respective fin, e.g., as discussed with respect to FIG. 3. Furthermore, each of the fins have varying widths. For example, the fin 1720 has a first width X9 along a first length of the fin, a second width X8 along a second length of the fin, and a third width X7 along a third length of the fin. For example, a channel region of a first transistor may be formed on or within the section of the fin 1720 having the first width X9, a channel region of a second transistor may be formed on or within the section of the fin 1720 having the second width X8, and a channel region of a third transistor may be formed on or within the section of the fin 1720 having the third width X7, e.g., as also discussed with respect to FIG. 3. Thus, the channel regions of the first, second, and third transistors are aligned along an imaginary line m3-m4 (e.g., as also discussed with respect to FIG. 3), where the line m3-m4 passes along a length of the fin 1720. Furthermore, the fin 1720 is substantially symmetrical about the line m3-m4, e.g., as discussed with respect to FIG. 3. Similar discussion also applies to the fin 1721.

As previously noted, a selective etch and replace process for replacing at least a portion of one or more of fins 1720, 1721 with fins having a different semiconductor material can be carried out in a similar fashion, in accordance with an embodiment of the present disclosure, such as previously described with respect to FIGS. 11D, 11E, 11F.

It is to be noted that the transition of widths in the fins 1720, 1721 (and/or their replacement fins, if present) are relatively sharp in FIGS. 17A, 17C, which may be an ideal scenario. However, in practice, a section of a fin with a first width may transition to a section of the fin having a second width over a length (e.g., length L1) of the fin, e.g., as discussed with respect to FIG. 3 in further details. So, for example, transitions may occur relatively abruptly such that the sidewall at the point where the transition begins is substantially orthogonal to the side of the fin, such as about 90 degrees, +/−5 degrees, according to some embodiments, but in other embodiments, the transition may occur over a longer distance so as to provide a transition angle of 80 to 95 degrees.

Figure 18A:
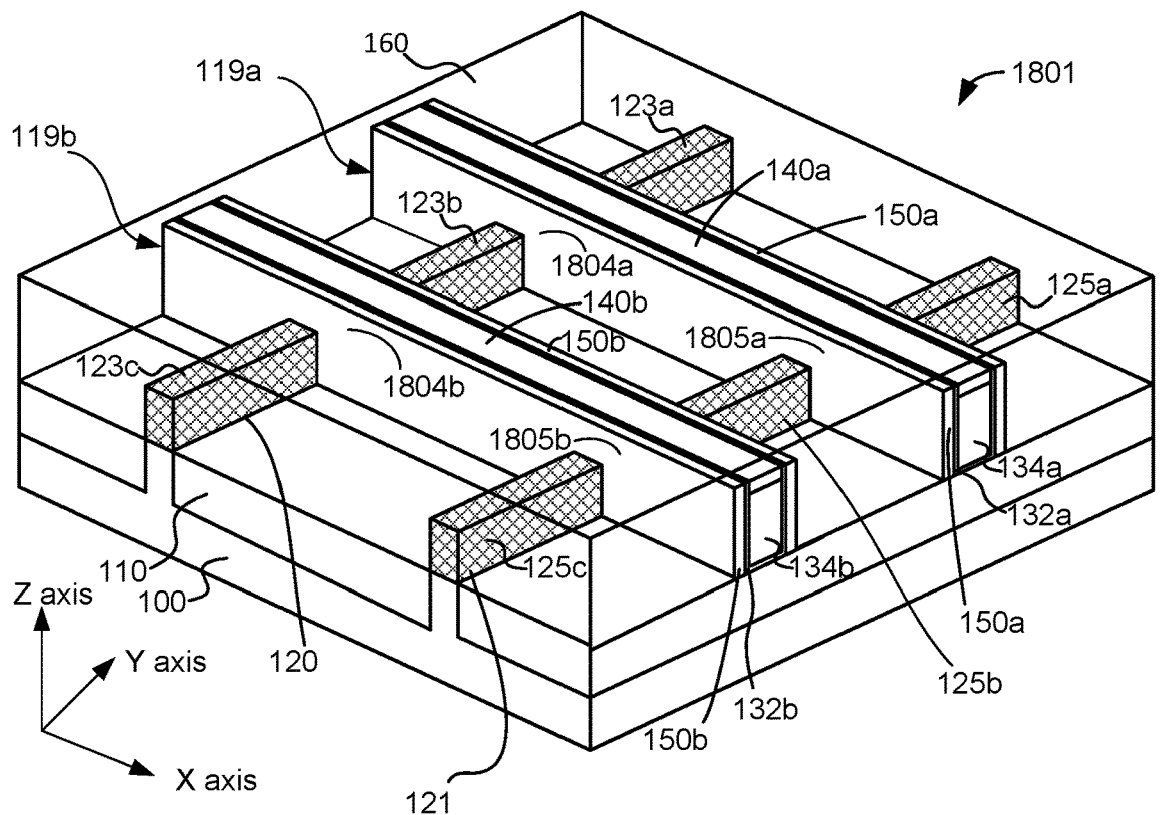
FIG. 18A-18B collectively illustrate an example integrated circuit structure including nanowire transistors having multiple widths of nanowires, in accordance with an embodiment of the present disclosure.
Figure 18B:
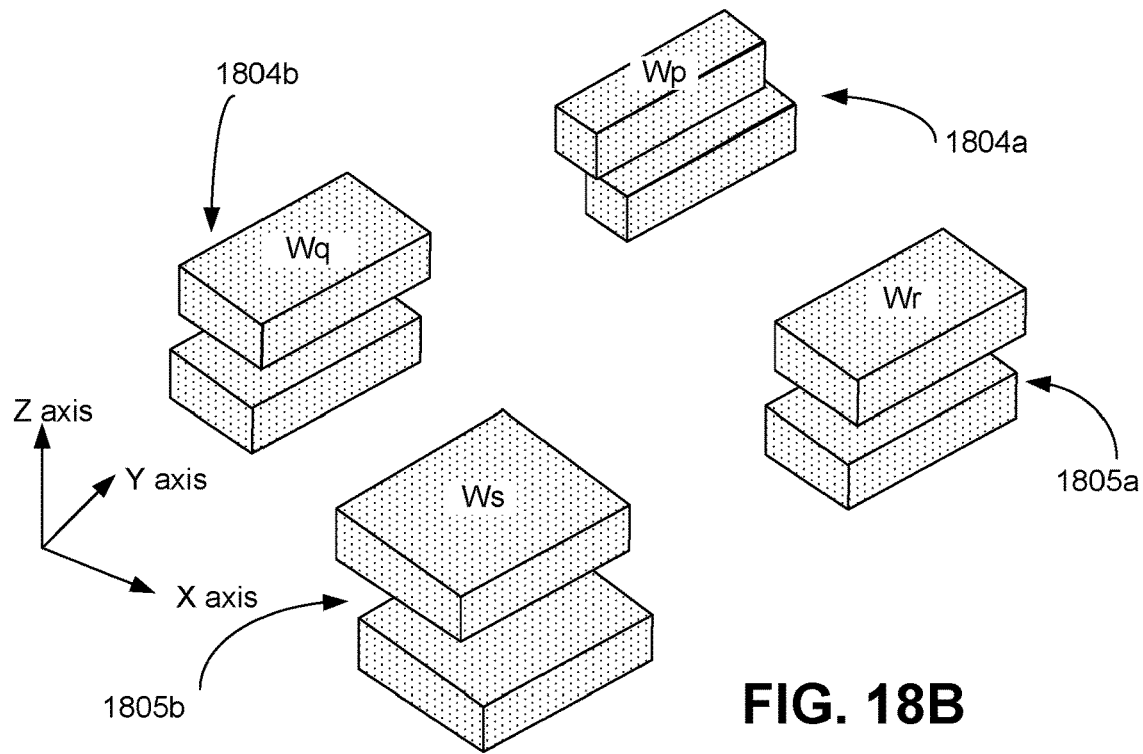

FIG. 18A-18B illustrates an example integrated circuit structure 1801 of nanowire transistors having multiple widths of nanowires, in accordance with an embodiment of the present disclosure. This embodiment is at least in part similar to an embodiment having a bulk fin. However, the channel structure under the gate structure in this example case includes first and second nanowires (or nanoribbons or nanosheets, as the case may be) 1804a, 1804, 1805a, 1805b, as best shown in FIG. 18B (which shows the channel structure without the gate structure or source/drain regions in place). While two wires are shown in FIGS. 18A-18B for individual channel regions, other embodiments may include fewer wires (one) or more wires (e.g., three, four, or more). The wires may be native to a multilayer substrate structure, or replacement material (e.g., SiGe nanowires above a silicon substrate), for example.

As can be further seen in FIG. 18B, the widths of the nanowires of the channel regions 1804a, 1804, 1805a, 1805b are respectively labelled as Wp, Wq, Wr, and Ws. For example, the two nanowires for the channel region 1804a each has the width Wp, the two nanowires for the channel region 1804b each has the width Wq, and so on. As seen, the nanowires may have significantly varying widths. In some embodiments, the nanowires may be formed using the methodologies discussed with respect to FIGS. 4A-11F. In other embodiments, the nanowires may be formed using the methodologies discussed with respect to FIGS. 12A-17C. The discussion associated with the fins throughout this disclosure is also applicable to the nanowires of the structure 1801 of FIGS. 18A-18B, as will be appreciated.

Example System

Figure 19:
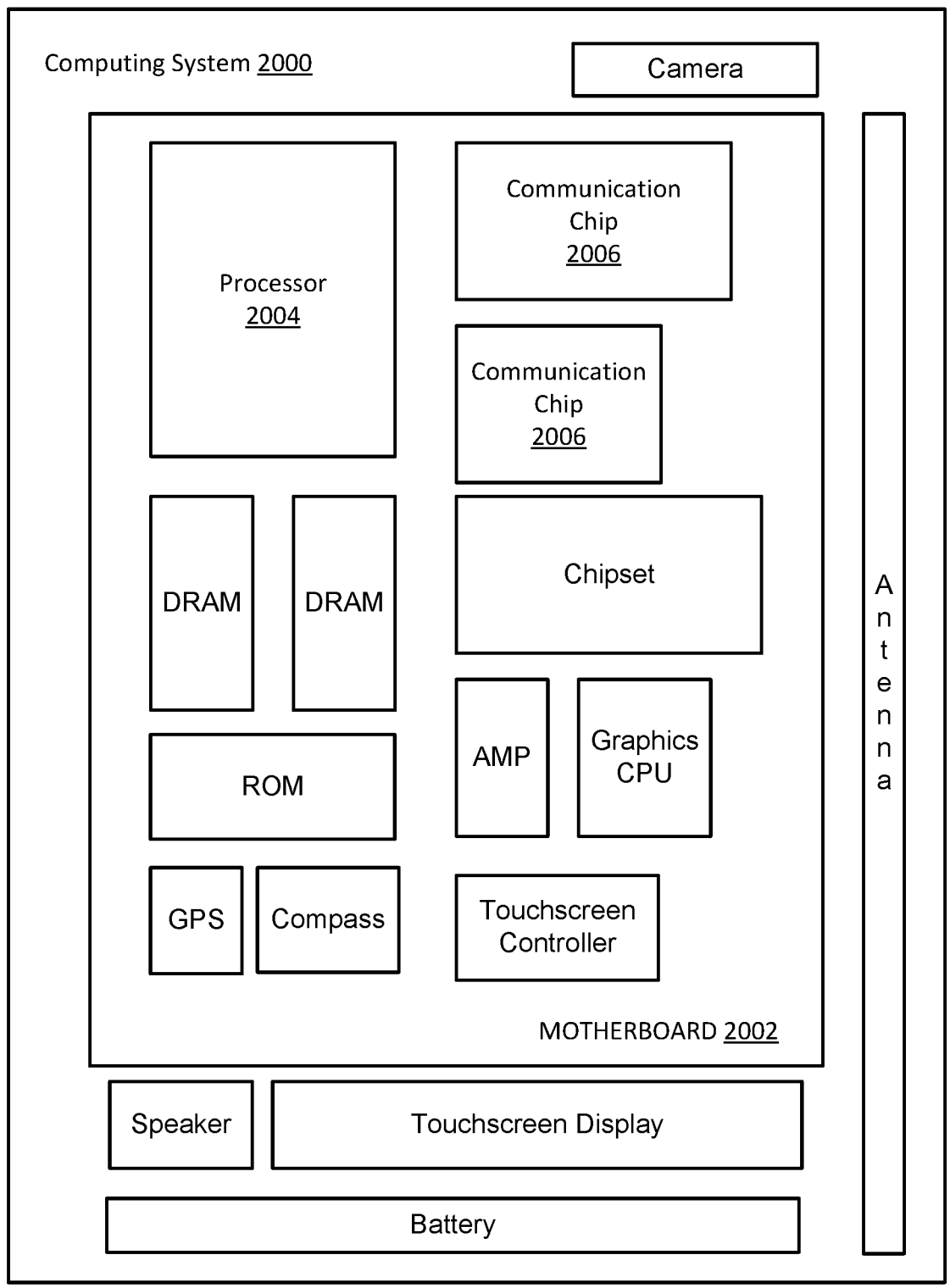
FIG. 19 illustrates an example computing system implemented with integrated circuit structures or devices formed using the techniques disclosed herein, in accordance with one or more embodiments of the present disclosure.

FIG. 19 illustrates an example computing system 2000 implemented with integrated circuit structures or devices formed using the techniques disclosed herein, in accordance with one or more embodiments of the present disclosure. As can be seen, the computing system 2000 houses a motherboard 2002. The motherboard 2002 may include a number of components, including, but not limited to, a processor 2004 and at least one communication chip 2006, each of which can be physically and electrically coupled to the motherboard 2002, or otherwise integrated therein. As will be appreciated, the motherboard 2002 may be, for example, any printed circuit board, whether a main board, a daughterboard mounted on a main board, or the only board of system 2000, etc.

Depending on its applications, computing system 2000 may include one or more other components that may or may not be physically and electrically coupled to the motherboard 2002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 2000 may include one or more integrated circuit structures or devices formed using the disclosed techniques in accordance with an example embodiment. In some embodiments, multiple functions can be integrated into one or more chips (e.g., for instance, note that the communication chip 2006 can be part of or otherwise integrated into the processor 2004).

The communication chip 2006 enables wireless communications for the transfer of data to and from the computing system 2000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 2000 may include a plurality of communication chips 2006. For instance, a first communication chip 2006 may be dedicated to shorter range wireless communications such as Wi-Fi and Bluetooth and a second communication chip 2006 may be dedicated to longer range wireless communications such as GPS, EDGE, GPRS, CDMA, WiMAX, LTE, Ev-DO, and others.

The processor 2004 of the computing system 2000 includes an integrated circuit die packaged within the processor 2004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 2006 also may include an integrated circuit die packaged within the communication chip 2006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 2004 (e.g., where functionality of any chips 2006 is integrated into processor 2004, rather than having separate communication chips). Further note that processor 2004 may be a chip set having such wireless capability. In short, any number of processor 2004 and/or communication chips 2006 can be used. Likewise, any one chip or chip set can have multiple functions integrated therein.

In various implementations, the computing device 2000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a semiconductor device, comprising: a body comprising semiconductor material and having a length, the body further having a first width at a first portion of the length and a second width at a second portion of the length, the first and second widths perpendicular to the length, the first width being 2 nm or more different from the second width; a first gate structure at least on top and sidewalls of the first portion of the body; and a second gate structure at least on top and sidewalls of the second portion of the body.

Example 2 includes the subject matter of Example 1, wherein the first width is less than 10 nm, and the second width is more than 12 nm.

Example 3 includes the subject matter of any of Examples 1-2, wherein the body is a first body, the device further comprising: a second body comprising semiconductor material and having a length, the second body further having a third width at a first portion of its length and a fourth width at a second portion of its length, the third and fourth widths perpendicular to the length of the second body and being 2 nm or more different from one another; a third gate structure at least on top and sidewalls of the first portion of the second body; and a fourth gate structure at least on top and sidewalls of the second portion of the second body.

Example 4 includes the subject matter of Example 3, wherein each of the first body and the second body has a first side and an opposing second side, the first side of the first body facing the first side of the second body, the first sides of the first and second bodies having a distance between them that varies less than 1 nm along their respective lengths.

Example 5 includes the subject matter of Example 3, wherein each of the first body and the second body has a first side and an opposing second side, the first side of the first body facing the first side of the second body, the first sides having a distance between them that varies more than 1 nm along their respective lengths, due to changes in width of the respective bodies.

Example 6 includes the subject matter of any of Examples 3-5, wherein one or more of the first, second, third, and fourth gate structures wraps around its respective body portion to provide a gate-all-around configuration.

Example 7 includes the subject matter of any of Examples 3-5, wherein one or more of the first, second, third, and fourth gate structures is on top and sides of its respective body portion to provide a tri-gate configuration.

Example 8 includes the subject matter of any of Examples 3-7, wherein the semiconductor material of the first body is compositionally distinct from the semiconductor material of the second body.

Example 9 includes the subject matter of any of Examples 3-8, wherein the semiconductor material of the first body comprises a monocrystalline group IV semiconductor material, and the semiconductor material of the second body comprises a monocrystalline group III-V semiconductor material.

Example 10 includes the subject matter of any of Examples 1-9, wherein a line width roughness (LWR) of the first portion of the length of the body is at most 7 Angstrom.

Example 11 includes the subject matter of any of Examples 1-10, wherein a transition from the first width to the second width in the body occurs with a transition angle of 85 to 90 degrees.

Example 12 includes the subject matter of any of Examples 1-11, wherein a transition from the first width to the second width in the body occurs within less than 1 nm along a length of the body.

Example 13 includes the subject matter of any of Examples 1-12, wherein the body has a first side and an opposing second side, and the transition from the first width to the second width is accomplished in a symmetrical fashion, in that both the first and second sides of the body change relative to an imaginary central axis passing along the length of the body.

Example 14 includes the subject matter of any of Examples 1-13, wherein the body has a first side and an opposing second side, and the transition from the first width to the second width is accomplished in an asymmetrical fashion, in that one the first side or the second side of the body varies to provide the change in width and the other of the first and second side of the body remains relatively constant.

Example 15 includes the subject matter of any of Examples 1-14, wherein the first and second gate structures each comprises a gate electrode and a gate dielectric, the gate dielectric being between the gate electrode and the body.

Example 16 includes the subject matter of any of Examples 1-15, wherein the first width is different from the second width by at least 8 nm.

Example 17 is a computing system comprising the subject matter of any of Examples 1-16.

Example 18 is an integrated circuit comprising: a first body and a second body comprising semiconductor material, wherein the first body and the second body are aligned, such that a first imaginary line passing through a center of the first body along a length of the first body substantially passes through a center of the second body along a length of the second body; a third body and a fourth body comprising semiconductor material, wherein the third body and the fourth body are aligned, such that a second imaginary line passing through a center of the third body along a length of the third body substantially passes through a center of the fourth body along a length of the fourth body; a first gate structure over the first body and the third body; and a second gate structure over the second body and the fourth body; wherein a lateral distance between a sidewall of the first body and a sidewall of the third body is substantially different from a lateral distance between a sidewall of the second body and a sidewall of the fourth body, the sidewall of the first body facing the sidewall of the third body, and the sidewall of the second body facing the sidewall of the fourth body.

Example 19 includes the subject matter of Example 18, wherein the integrated circuit further comprises: a first source or drain region between the first body and the second body; and a second source or drain region between the third body and the fourth body.

Example 20 includes the subject matter of any of Examples 18-19, wherein: a first width of the first body differs by at least 6 nanometers from at least one of: a second width of the second body, a third width of the third body, or a fourth width of the fourth body; the first width and the second width are along a direction perpendicular to the first imaginary line passing through the center of the first body; and the third width and the fourth width are along a direction perpendicular to the second imaginary line passing through the center of the third body.

Example 21 includes the subject matter of any of Examples 18-20, wherein one or both of the first and second gate structures wraps around one or more of its respective bodies to provide a gate-all-around configuration.

Example 22 includes the subject matter of any of Examples 18-20, wherein one or both of the first and second gate structures is on top and sides of one or more of its respective bodies to provide a tri-gate configuration.

Example 23 includes the subject matter of any of Examples 18-22, wherein the semiconductor material of the first and second bodies is compositionally distinct from the semiconductor material of the third and fourth bodies.

Example 24 includes the subject matter of any of Examples 18-23, wherein the semiconductor material of the first and second bodies comprises a monocrystalline group IV semiconductor material, and the semiconductor material of the third and fourth bodies comprises a monocrystalline group III-V semiconductor material.

Example 25 includes the subject matter of any of Examples 18-24, wherein the first and second gate structures each comprises a gate electrode and a gate dielectric, the gate dielectric being between the gate electrode and the corresponding body.

Example 26 is an integrated circuit comprising: a first body and a second body comprising semiconductor material, the first body having a first sidewall, and the second body having a second sidewall that is colinear with the first sidewall; a third body and a fourth body comprising semiconductor material, the third body having a third sidewall, and the fourth body having a fourth sidewall that is colinear with the third sidewall; and a first gate structure over the first body and the third body; and a second gate structure over the second body and the fourth body; wherein a lateral distance between the first sidewall of the first body and third sidewall of the third body is substantially the same as a lateral distance between the second sidewall of the second body and the fourth sidewall of the fourth body, the first sidewall of the first body facing the third sidewall of the third body, and the second sidewall of the second body facing the fourth sidewall of the fourth body, and wherein a first width of the first body differs by at least 6 nanometers from at least one of: a second width of the second body, a third width of the third body, or a fourth width of the fourth body, the first width and the second width are along a direction perpendicular to the first sidewall, and the third width and the fourth width are along a direction perpendicular to the third sidewall.

Example 27 includes the subject matter of Example 26, wherein the integrated circuit further comprises: a first source or drain region between the first body and the second body; and a second source or drain region between the third body and the fourth body.

Example 28 includes the subject matter of any of Examples 26-27, wherein one or both of the first and second gate structures wraps around one or more of its respective bodies to provide a gate-all-around configuration.

Example 29 includes the subject matter of any of Examples 26-27, wherein one or both of the first and second gate structures is on top and sides of one or more of its respective bodies to provide a tri-gate configuration.

Example 30 includes the subject matter of any of Examples 26-29, wherein the semiconductor material of the first and second bodies is compositionally distinct from the semiconductor material of the third and fourth bodies.

Example 31 includes the subject matter of any of Examples 26-30, wherein the semiconductor material of the first and second bodies comprises a monocrystalline group IV semiconductor material, and the semiconductor material of the third and fourth bodies comprises a monocrystalline group III-V semiconductor material.

Example 32 includes the subject matter of any of Examples 26-31, wherein the first and second gate structures each comprises a gate electrode and a gate dielectric, the gate dielectric being between the gate electrode and the corresponding body.

Example 33 includes the subject matter of any of Examples 26-32, wherein a line width roughness (LWR) of the first body is at most 7 Angstrom.

Example 34 is a method of forming a fin for two or more transistors, the method comprising: providing a first layer comprising material for the fin; forming, above the first layer, one or more layers comprising hardmask material; forming a first structure above the one or more layers, the first structure having at least a first section and a second section, wherein a width of the first section is different from a width of the second section, and wherein the widths of the first and second section are along a direction that is perpendicular to a length of the first structure; patterning the one or more layers with the first structure as a masking layer and subsequently removing the first structure, such that the first structure is transferred as a second structure in the one or more layers; and patterning the first layer with the second structure as a masking layer and subsequently removing the second structure, such that the second structure is transferred as a fin in the first layer.

Example 34 includes the subject matter of Example 34, wherein forming the first structure comprises: removing the first structure at the first section, without removing the first structure at the second section; and conformally depositing material of the first structure to expand the first structure, such that the width of the second section is higher than the width of the first section.

Example 36 includes the subject matter of any of Examples 34-35, wherein the structure comprises a first portion formed on a first side of a second layer comprising hardmask material, and a second portion formed on a second side of the second layer, and wherein forming the first structure comprises: removing the second layer to form a gap between the first portion and the second portion, wherein a lateral distance of the gap is substantially constant along the length of the structure.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor device, comprising:
   a body comprising semiconductor material and having a length, the body further having a first width at a first portion of the length and a second width at a second portion of the length and a third width at a third portion of the length, the first and second and third widths perpendicular to the length, the first different from the second width, and the third width different from the second width and different from the first width;
   a first gate structure at least on top and sidewalls of the first portion of the body; and
   a second gate structure at least on top and sidewalls of the second portion of the body.

2. The device of claim 1, wherein the first width is less than 10 nm, and the second width is more than 12 nm.

3. The device of claim 1, wherein the body is a first body, the device further comprising:
   a second body comprising semiconductor material and having a length, the second body further having a fourth width at a first portion of its length and a fifth width at a second portion of its length, the fourth and fifth widths perpendicular to the length of the second body and being 2 nm or more different from one another;
   a third gate structure at least on top and sidewalls of the first portion of the second body; and
   a fourth gate structure at least on top and sidewalls of the second portion of the second body.

4. The device of claim 3, wherein each of the first body and the second body has a first side and an opposing second side, the first side of the first body facing the first side of the second body, the first sides of the first and second bodies having a distance between them that varies less than 1 nm along their respective lengths.

5. The device of claim 3, wherein each of the first body and the second body has a first side and an opposing second side, the first side of the first body facing the first side of the second body, the first sides having a distance between them that varies more than 1 nm along their respective lengths, due to changes in width of the respective bodies.

6. The device of claim 3, wherein one or more of the first, second, third, and fourth gate structures wraps around its respective body portion to provide a gate-all-around configuration.

7. The device of claim 3, wherein one or more of the first, second, third, and fourth gate structures is on top and sides of its respective body portion to provide a tri-gate configuration.

8. The device of claim 3, wherein the semiconductor material of the first body is compositionally distinct from the semiconductor material of the second body.

9. The device of claim 1, wherein a line width roughness (LWR) of the first portion of the length of the body is at most 7 Angstrom.

10. The device of claim 1, wherein a transition from the first width to the second width in the body occurs with a transition angle of 85 to 90 degrees.

11. The device of claim 1, wherein a transition from the first width to the second width in the body occurs within less than 1 nm along a length of the body.

12. The device of claim 1, wherein the body has a first side and an opposing second side, and a transition from the first width to the second width is accomplished in a symmetrical fashion, in that both the first and second sides of the body change relative to an imaginary central axis passing along the length of the body.

13. The device of claim 1, wherein the body has a first side and an opposing second side, and a transition from the first width to the second width is accomplished in an asymmetrical fashion, in that one the first side or the second side of the body varies to provide the change in width and the other of the first and second side of the body remains relatively constant.

14. The device of claim 1, wherein the first width is different from the second width by at least 8 nm.

15. A computing system comprising the device of claim 1.

16. An integrated circuit comprising:
a first body and a second body comprising semiconductor material, wherein the first body and the second body are aligned, such that a first imaginary line passing through a center of the first body along a length of the first body substantially passes through a center of the second body along a length of the second body;
a third body and a fourth body comprising semiconductor material, wherein the third body and the fourth body are aligned, such that a second imaginary line passing through a center of the third body along a length of the third body substantially passes through a center of the fourth body along a length of the fourth body, wherein one of the first body, the second body, the third body or the fourth body has a first width, a second width and a third width, the first width different from the second width, and the third width different from the second width and different from the first width;
a first gate structure over the first body and the third body; and
a second gate structure over the second body and the fourth body;
wherein a lateral distance between a sidewall of the first body and a sidewall of the third body is substantially different from a lateral distance between a sidewall of the second body and a sidewall of the fourth body, the sidewall of the first body facing the sidewall of the third body, and the sidewall of the second body facing the sidewall of the fourth body.

17. The integrated circuit of claim 16, further comprising:
a first source or drain region between the first body and the second body; and a second source or drain region between the third body and the fourth body.

18. The integrated circuit of claim 16, wherein:
a first width of the first body differs by at least 6 nanometers from at least one of:
a second width of the second body, a third width of the third body, or a fourth width of the fourth body; the first width and the second width are along a direction perpendicular to the first imaginary line passing through the center of the first body; and
the third width and the fourth width are along a direction perpendicular to the second imaginary line passing through the center of the third body.

19. An integrated circuit comprising:
a first body and a second body comprising semiconductor material, the first body having a first sidewall, and the second body having a second sidewall that is colinear with the first sidewall;
a third body and a fourth body comprising semiconductor material, the third body having a third sidewall, and the fourth body having a fourth sidewall that is colinear with the third sidewall, wherein one of the first body, the second body, the third body or the fourth body has a first width, a second width and a third width, the first width different from the second width, and the third width different from the second width and different from the first width; and
a first gate structure over the first body and the third body; and
a second gate structure over the second body and the fourth body;
wherein a lateral distance between the first sidewall of the first body and third sidewall of the third body is substantially a same as a lateral distance between the second sidewall of the second body and the fourth sidewall of the fourth body, the first sidewall of the first body facing the third sidewall of the third body, and the second sidewall of the second body facing the fourth sidewall of the fourth body, and wherein a first width of the first body differs by at least 6 nanometers from at least one of:
a second width of the second body, a third width of the third body, or a fourth width of the fourth body, the first width and the second width are along a direction perpendicular to the first sidewall, and the third width and the fourth width are along a direction perpendicular to the third sidewall.

20. The integrated circuit of claim 19, further comprising:
a first source or drain region between the first body and the second body; and
a second source or drain region between the third body and the fourth body.

21. A semiconductor device, comprising:
a body comprising semiconductor material and having a length, the body further having a first width at a first portion of the length and a second width at a second portion of the length, the first and second widths perpendicular to the length, the first width being 2 nm or more different from the second width, wherein a transition from the first width to the second width in the body occurs within less than 1 nm along a length of the body;
a first gate structure at least on top and sidewalls of the first portion of the body; and
a second gate structure at least on top and sidewalls of the second portion of the body.

* * * * *